US010522590B2

United States Patent
Satoh et al.

(10) Patent No.: US 10,522,590 B2
(45) Date of Patent: Dec. 31, 2019

(54) MAGNETIC MEMORY INCORPORATING DUAL SELECTORS

(71) Applicant: Avalanche Technology, Inc., Fremont, CA (US)

(72) Inventors: Kimihiro Satoh, Fremont, CA (US); Hongxin Yang, Newark, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 15/921,552

(22) Filed: Mar. 14, 2018

(65) Prior Publication Data

US 2019/0288031 A1   Sep. 19, 2019

(51) Int. Cl.
| | |
|---|---|
| *H01L 27/22* | (2006.01) |
| *H01L 43/02* | (2006.01) |
| *H01F 10/32* | (2006.01) |
| *G11C 11/16* | (2006.01) |
| *H01L 43/08* | (2006.01) |
| *H01L 43/10* | (2006.01) |

(52) U.S. Cl.
CPC .......... *H01L 27/222* (2013.01); *G11C 11/161* (2013.01); *G11C 11/1659* (2013.01); *H01F 10/3268* (2013.01); *H01L 43/02* (2013.01); *H01L 43/08* (2013.01); *H01L 43/10* (2013.01)

(58) Field of Classification Search
CPC ....... H01L 27/22; H01L 27/222; H01L 43/02; H01L 43/08; H01L 43/10
USPC ........................................................ 257/421
See application file for complete search history.

(56) References Cited

U.S. PATENT DOCUMENTS

| | | | |
|---|---|---|---|
| 8,780,651 B2 | 7/2014 | Yan et al. | |
| 9,312,307 B2 | 4/2016 | Bateman | |
| 9,614,003 B1* | 4/2017 | Richter | ................ G11C 11/161 |
| 9,647,035 B2 | 5/2017 | Tran et al. | |
| 10,134,457 B1* | 11/2018 | Mihajlovic | ........... G11C 11/161 |
| 10,134,984 B1* | 11/2018 | Jo | ........................ H01L 45/1253 |
| 2015/0021675 A1* | 1/2015 | Min | ........................ H01L 43/08 |
| | | | 257/295 |
| 2016/0020250 A1* | 1/2016 | Li | .......................... H01L 27/224 |
| | | | 365/158 |
| 2016/0087197 A1* | 3/2016 | Tran | .................... H01L 45/1666 |
| | | | 257/5 |
| 2018/0166500 A1* | 6/2018 | Wang | ...................... G11C 11/16 |
| 2018/0211703 A1* | 7/2018 | Choi | .................. G11C 13/0038 |
| 2018/0240844 A1* | 8/2018 | Yang | ..................... H01L 27/224 |
| 2018/0240845 A1* | 8/2018 | Yang | .................... G11C 11/1659 |

(Continued)

*Primary Examiner* — Fazli Erdem
(74) *Attorney, Agent, or Firm* — Bing K. Yen

(57) ABSTRACT

The present invention is directed to a memory device including a magnetic memory element; a horizontal conductive line disposed above the magnetic memory element; a bottom electrode formed beneath the magnetic memory element and having a top, first and second sides that are opposite to each other; a first vertical conductive line formed adjacent to the first side of the bottom electrode with a first volatile switching layer and a first electrode layer interposed therebetween; and a second vertical conductive line formed adjacent to the second side of the bottom electrode with a second volatile switching layer and a second electrode layer interposed therebetween. The magnetic memory element is electrically connected to the horizontal conductive line at one end and to the bottom electrode at the other end.

13 Claims, 21 Drawing Sheets

(56) References Cited

U.S. PATENT DOCUMENTS

2018/0358547 A1* 12/2018 Yang ................... H01L 43/12
2018/0366171 A1* 12/2018 Li ...................... G11C 11/161
2019/0165264 A1*  5/2019 Wu ..................... H01L 45/126

* cited by examiner

MAGNETIC MEMORY INCORPORATING DUAL SELECTORS

BACKGROUND

The present invention relates to an array of memory cells for memory applications, and more particularly, to embodiments of a magnetic memory cell incorporating therein a magnetic memory element and dual selectors coupled thereto.

Spin transfer torque magnetic random access memory (STT-MRAM) is a new class of non-volatile memory, which can retain the stored information when powered off. An STT-MRAM device normally comprises an array of memory cells, each of which includes at least a magnetic memory element and a selection transistor coupled in series between appropriate electrodes. Upon application of a switching current to the magnetic memory element, the electrical resistance of the magnetic memory element would change accordingly, thereby switching the stored logic in the respective memory cell.

FIG. 1 is a schematic circuit diagram of a conventional memory array 20, which comprises a plurality of memory cells 22 with each of the memory cells 22 including a selection transistor 24 coupled to a magnetic memory element 26; a plurality of parallel word lines 28 with each being coupled to the gates of a respective row of the selection transistors 24 in a first direction; a plurality of parallel bit lines 30 with each being coupled to a respective row of the magnetic memory elements 26 in a second direction substantially perpendicular to the first direction; and a plurality of parallel source lines 32 with each being coupled to a respective row of the selection transistors 24 in the first or second direction.

FIG. 2 shows a conventional memory element for the STT-MRAM device comprising a magnetic reference layer 50 and a magnetic free layer 52 with an insulating tunnel junction layer 54 interposed therebetween, thereby collectively forming a magnetic tunneling junction (MTJ) 56. The magnetic reference layer 50 and free layer 52 have magnetization directions 58 and 60, respectively, which are substantially perpendicular to the layer planes. Therefore, the MTJ 56 is a perpendicular type comprising the magnetic layers 50 and 52 with perpendicular anisotropy. Upon application of a switching current to the perpendicular MTJ 56, the magnetization direction 60 of the magnetic free layer 52 can be switched between two directions: parallel and anti-parallel with respect to the magnetization direction 58 of the magnetic reference layer 50. The insulating tunnel junction layer 54 is normally made of a dielectric material with a thickness ranging from a few to a few tens of angstroms. When the magnetization directions 60 and 58 of the magnetic free layer 52 and reference layer 50 are substantially parallel, electrons polarized by the magnetic reference layer 50 can tunnel through the insulating tunnel junction layer 54, thereby decreasing the electrical resistance of the perpendicular MTJ 56. Conversely, the electrical resistance of the perpendicular MTJ 56 is high when the magnetization directions 58 and 60 of the magnetic reference layer 50 and free layer 52 are substantially anti-parallel. Accordingly, the stored logic in the magnetic memory element can be switched by changing the magnetization direction 60 of the magnetic free layer 52.

The conventional memory array 20 for STT-MRAM illustrated in FIG. 1 is mostly limited to a single layer because the fabrication of the selection transistors 24 typically requires an epitaxial silicon substrate. Therefore, there is a need for an STT-MRAM cell that is stackable to form a three-dimensional memory array and that can be inexpensively manufactured.

SUMMARY

The present invention is directed to a memory cell that satisfies this need. A memory device having features of the present invention comprises a magnetic memory element; a horizontal conductive line disposed above the magnetic memory element; a bottom electrode formed beneath the magnetic memory element and having a top, first and second sides with the two sides being opposite to each other; a first vertical conductive line formed adjacent to the first side of the bottom electrode with a first volatile switching layer and a first electrode layer interposed therebetween; and a second vertical conductive line formed adjacent to the second side of the bottom electrode with a second volatile switching layer and a second electrode layer interposed therebetween. The magnetic memory element is electrically connected to the horizontal conductive line at one end and to the bottom electrode at the other end. The first and second volatile switching layers may have different switching voltages and may be used for read and write operations, respectively.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

Figure 1:
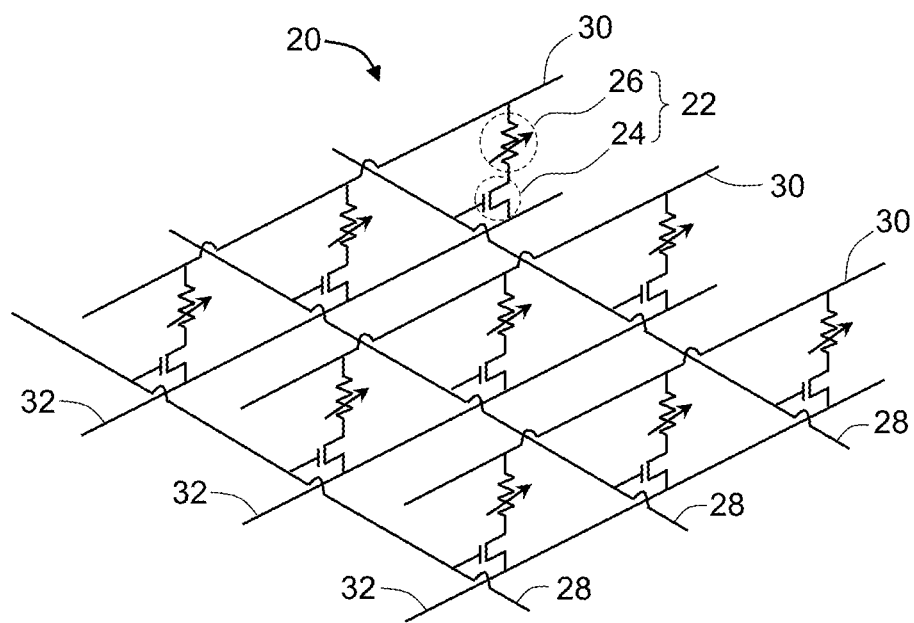
FIG. 1 is a schematic view of an array of conventional magnetic memory cells, each of which including a magnetic memory element coupled to a selection transistor in series.
Figure 2:
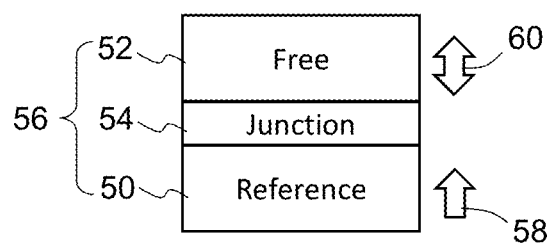
FIG. 2 is cross sectional view of a conventional magnetic memory element including a magnetic tunnel junction (MTJ)

Where reference is made herein to a method comprising two or more defined steps, the defined steps can be carried out in any order or simultaneously (except where the context excludes that possibility), and the method can include one or more other steps which are carried out before any of the defined steps, between two of the defined steps, or after all the defined steps (except where the context excludes that possibility).

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "(a first number) to (a second number)" or "(a first number)-(a second number)," this means a range whose lower limit is the first number and whose upper limit is the second number. For example, "25 to 100 nm" means a range whose lower limit is 25 nm and whose upper limit is 100 nm.

An embodiment of the present invention as applied to a stackable memory cell incorporating dual selector elements will now be described with reference to FIG. 3. The illustrated memory cell 100 comprises a magnetic memory element 102; a horizontal conductive line 104 disposed above the magnetic memory element 102; and a bottom electrode 106, which has a top and two opposite sides, formed beneath the magnetic memory element 102. The magnetic memory element 102 is electrically coupled to the horizontal conductive line 104 at one end and to the bottom electrode 106 at the other end. One of the two opposite sides of the bottom electrode 106 extends toward a first vertical conductive line 108 with a volatile switching layer 110 and a vertical electrode layer 112 interposed therebetween. A vertical dielectric layer 114 is formed between the horizontal conductive line 104/the magnetic memory element 102 and the volatile switching layer 110 to electrically insulate the horizontal conductive line 104 and the magnetic memory element 102 from the volatile switching layer 110, the vertical electrode layer 112, and the first vertical conductive line 108. The bottom electrode 106, the volatile switching layer 110, and the vertical electrode layer 112 collectively form a first bidirectional selector element coupled to the magnetic memory element 102. While the volatile switching layer 110 extends along the vertical direction, only the portion in the vicinity of the side of the bottom electrode 106 is able to switch the resistance thereof and forms a part of the first selector element. The rest of the volatile switching layer 110 is electrically insulated by the vertical dielectric layer 114 and is therefore inactive.

Likewise, the other one of the two opposite sides of the bottom electrode 106 extends toward a second vertical conductive lines 108' with another volatile switching layer 110' and another vertical electrode layer 112' interposed therebetween. Another vertical dielectric layer 114' is formed between the horizontal conductive line 104/the magnetic memory element 102 and the volatile switching layer 110' to electrically insulate the horizontal conductive line 104 and the magnetic memory element 102 from the volatile switching layer 110', the vertical electrode layer 112', and the second vertical conductive line 108'. The bottom electrode 106, the volatile switching layer 110', and the vertical electrode layer 112' collectively form a second bidirectional selector element coupled to the magnetic memory element 102.

Accordingly, the first and second selector elements are formed at two opposite sides of the bottom electrode 106. A current can flow between the first vertical conductive line 108 and the horizontal conductive line 104 via the first selector element, the bottom electrode 106, and the magnetic memory element 102 by applying appropriate voltages to the first vertical conductive line 108 and the horizontal conductive line 104, respectively. Likewise, another current can flow between the second vertical conductive line 108' and the horizontal conductive line 104 via the second selector element, the bottom electrode 106, and the magnetic memory element 102 by applying appropriate voltages to the second vertical conductive line 108' and the horizontal conductive line 104, respectively. Still another current can flow between the two vertical conductive lines 108 and 108' via the first selector element, the bottom electrode 106, and the second selector element by applying appropriate voltages to the two vertical conductive lines 108 and 108', respectively.

Figure 4A:
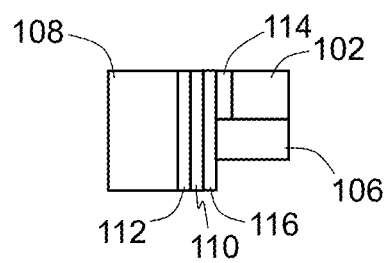
FIGS. 4A-4E are cross sectional views illustrating various embodiments for the selector element.
Figure 4C:
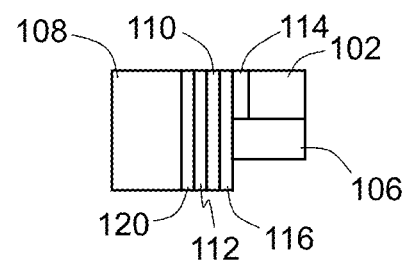
Figure 4B:
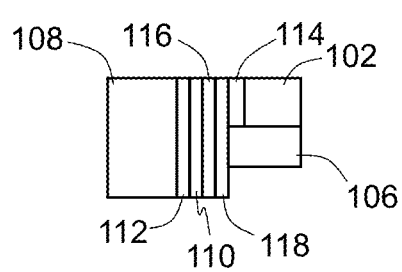
Figure 4D:
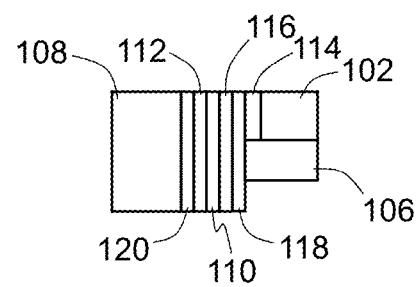
Figure 4E:
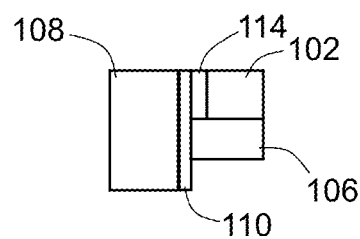

The first and second selector elements each may include one or more additional vertical electrode layers between the bottom electrode 106 and the respective vertical conductive line 108 or 108'. FIG. 4A illustrates an exemplary structure for the first selector element that includes an additional vertical electrode layer 116 formed between the volatile switching layer 110 and the bottom electrode 106. The exemplary structure of FIG. 4A may be modified by inserting another additional vertical electrode layer 118 between the volatile switching layer 110 and the bottom electrode 106 as illustrated in FIG. 4B. The exemplary structures of FIGS. 4A and 4B may be further modified by inserting still another additional vertical electrode layer 120 between the volatile switching layer 110 and the first vertical conductive line 108 as shown in FIGS. 4C and 4D, respectively. In an alternative embodiment illustrated in FIG. 4E, the first selector element does not include any vertical electrode layer and simply uses the first vertical conductive line 108 as an electrode. The second selector element may have one of the exemplary structures shown in FIGS. 4A-4E. Depending on the intended operating scheme for the magnetic memory cell 100, the first and second selector elements may have the same structure or different structures (i.e., different number of electrode layers and/or different electrode materials and/or different switching layer materials).

One or more of the vertical electrode layers 112, 112', 116-120 each may include one or more of the following elements: Au, Ag, Cu, Pt, Pd, Ni, Ir, Rh, Co, Os, Ru, Fe, Re, Mn, W, Mo, Cr, Ta, Nb, V, Hf, Zr, Ti, Mg, Zn, Cd, In, Ga, Al, B, Pb, Sn, Ge, Si, C, Bi, Sb, As, N, Te, Se, and O to form a suitable electrode material, such as but not limited to Au, Ag, Pt, Pd, Rh, Ir, Ru, Re, Si, Ni, NiSi$_x$, NiCr$_x$, Cu, CuSi$_x$, CuGe$_x$, CuAl$_x$, CuN$_x$, Co, CoSi$_x$, CoCr$_x$, Zn, ZnN$_x$, Fe, FeNi$_x$Cr$_y$, Cr, CrSi$_x$, Al, AlN$_x$, Ti, TiSi$_x$, TiN$_x$, Ta, TaSi$_x$, TaN$_x$, W, WSi$_x$, WN$_x$, Mo, MoSi$_x$, MoN$_x$, Zr, ZrSi$_x$, ZrN$_x$, Hf, HfSi$_x$, HfN$_x$, Nb, NbSi$_x$, NbN$_x$, V, VSi$_x$, VN$_x$, TiAl$_x$, NiAl$_x$, CoAl$_x$, or any combination thereof.

One or more of the vertical electrode layers 112, 112', 116-120 each may alternatively have a multilayer structure formed by interleaving one or more layers of a first material with one or more layers of a second material. The first and second materials each may include one or more of the following elements: Au, Ag, Cu, Pt, Pd, Ni, Ir, Rh, Co, Os, Ru, Fe, Re, Mn, W, Mo, Cr, Ta, Nb, V, Hf, Zr, Ti, Mg, Zn, Cd, In, Ga, Al, B, Pb, Sn, Ge, Si, C, Bi, Sb, As, N, Te, and Se to form a suitable electrode material, such as but not limited to Au, Ag, Pt, Pd, Rh, Ir, Ru, Re, Si, Ni, NiSi$_x$, NiCr$_x$, Cu, CuSi$_x$, CuGe$_x$, CuAl$_x$, CuN$_x$, Co, CoSi$_x$, CoCr$_x$, Zn, ZnN$_x$, Fe, FeNi$_x$Cr$_y$, Cr, CrSi$_x$, Al, AlN$_x$, Ti, TiSi$_x$, TiN$_x$, Ta, TaSi$_x$, TaN$_x$, W, WSi$_x$, WN$_x$, Mo, MoSi$_x$, MoN$_x$, Zr, ZrSi$_x$, ZrN$_x$, Hf, HfSi$_x$, HfN$_x$, Nb, NbSi$_x$, NbN$_x$, V, VSi$_x$, VN$_x$, TiAl$_x$, NiAl$_x$, CoAl$_x$, or any combination thereof.

The volatile switching layers 110 and 110' behave like a volatile device that is nominally insulative in the absence of an applied voltage or current. Upon continuing application of a switching voltage or current, however, the volatile switching layers 110 and 110' become conductive. The volatile switching layers 110 and 110' revert back to the insulative state again upon removal of the applied voltage or current. The volatile switching layers 110 and 110' each may be made of a nominally insulating material or any suitable material that switches its resistance in the presence of an applied field or current, such as but not limited to SiO$_x$, SiN$_x$, AlO$_x$, MgO$_x$, TaO$_x$, VO$_x$, NbO$_x$, TiO$_x$, WO$_x$, HfO$_x$, ZrO$_x$, NiO$_x$, FeO$_x$, YO$_x$, EuO$_x$, SrO$_x$, AsO$_x$, SbO$_x$, SnO$_x$, InO$_x$, SeO$_x$, GaO$_x$, CeO$_x$, TeO$_x$, CuGe$_x$S$_y$, CuAg$_x$Ge$_y$S$_z$, GeSb$_x$Te$_y$, AgIn$_x$Sb$_y$Te$_z$, GeTe$_x$, SbTe$_x$, GeSb$_x$, CrO$_x$, SrTi$_x$O$_y$, YZr$_x$O$_y$, LaF$_x$, AgI$_x$, CuI$_x$, RbAg$_x$I$_y$, or any combination thereof. The exemplary compounds may be stoichiometric or non-stoichiometric. One or more of the volatile switching layers 110 and 110' may further include one or more dopant or alloying elements, such as but not limited to Ag, Au, Zn, Sn, Ni, As, and Cu.

Alternatively, one or more of the volatile switching layers 110 and 110' may have a composite structure comprising a plurality of metal-rich particles or clusters embedded in a nominally insulating matrix. The nominally insulating matrix may be made of any suitable material, such as but not limited to SiO$_x$, SiN$_x$, AlO$_x$, MgO$_x$, TaO$_x$, VO$_x$, NbO$_x$, TiO$_x$, WO$_x$, HfO$_x$, ZrO$_x$, NiO$_x$, FeO$_x$, YO$_x$, EuO$_x$, SrO$_x$, AsO$_x$, SbO$_x$, SnO$_x$, InO$_x$, SeO$_x$, GaO$_x$, CeO$_x$, TeO$_x$, CuGe$_x$S$_y$, CuAg$_x$Ge$_y$S$_z$, GeSb$_x$Te$_y$, AgInSb$_y$Te$_z$, GeTe$_x$, SbTe$_x$, GeSb$_x$, CrO$_x$, SrTi$_x$O$_y$, YZr$_x$O$_y$, LaF$_x$, AgI$_x$, CuI$_x$, RbAg$_x$I$_y$, or any combination thereof. The exemplary compounds may be stoichiometric or non-stoichiometric. The plurality of metal-rich particles or clusters may be made of a relatively inert metal, or an alloy including one or more inert metals, or a fast electric field enhanced diffuser material, or any combination thereof. Examples of the inert metal include gold (Au), silver (Ag), platinum (Pt), palladium (Pd), rhodium (Rh), iridium (Ir), ruthenium (Ru), osmium (Os), rhenium (Re), and any combinations thereof. Examples of the fast electric field enhanced diffuser material include nickel (Ni), copper (Cu), silver (Ag), gold (Au), zinc (Zn), cobalt (Co), iron (Fe), tungsten (W), molybdenum (Mo), tantalum (Ta), niobium (Nb), aluminum (Al), titanium (Ti), zirconium (Zr), arsenic (As), titanium nitride (TiN$_x$), zirconium nitride (ZrN$_x$), tantalum nitride (TaN$_x$), niobium nitride (NbN$_x$), tungsten nitride (WN$_x$), and any combinations thereof. The exemplary nitrides may be stoichiometric or non-stoichiometric.

Still alternatively one or more of the volatile switching layers 110 and 110' may have a multilayer structure comprising one or more conductive layers interleaved with two or more insulating layers. The conductive layers may be made of any of the suitable conductive materials described above for the metal-rich particles or clusters. The thickness of the conductive layers may range from several angstroms to several nanometers. In some cases where the conductive layers are extremely thin, one or more of the conductive layers may be punctured by holes, thereby rendering the layer coverage to be discontinuous in some regions. Similarly, the nominally insulating layers may be made of any of the suitable insulating materials described above for the composite matrix.

Figure 4F:
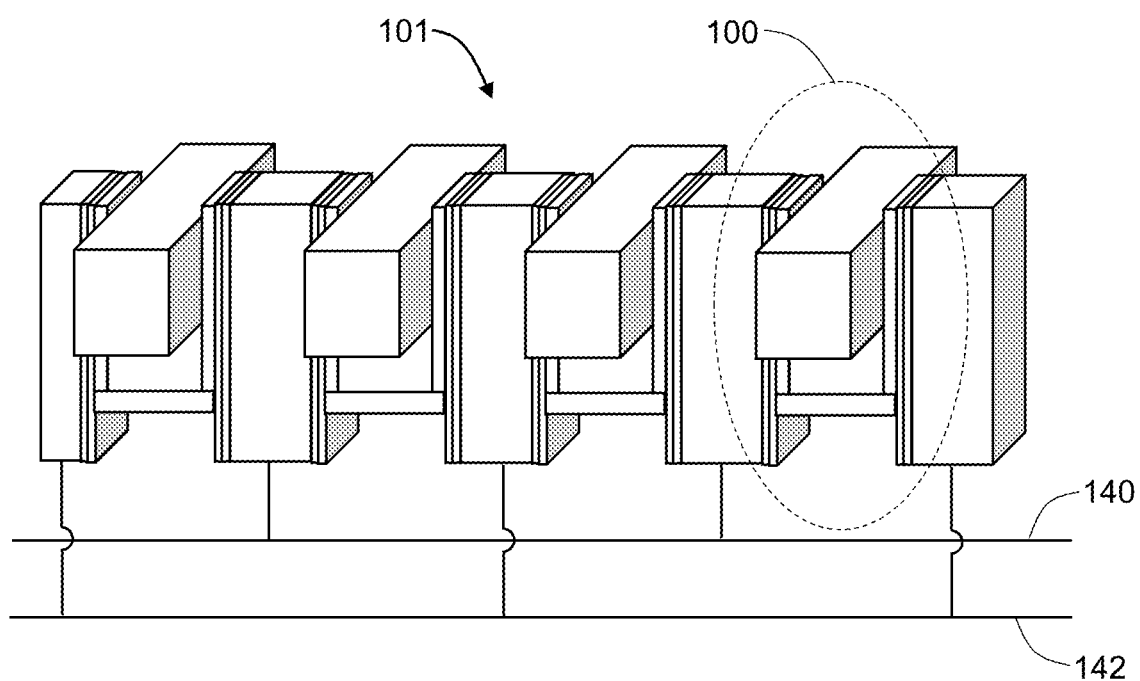
FIG. 4F is a perspective view of a row of magnetic memory cells in accordance with an embodiment of the present invention.

FIG. 4F illustrates a string or row of memory cells 101 extending along a horizontal direction in accordance with an embodiment of the present invention. Two adjacent memory cells 100 may share a common first or second vertical conductive line. All of the first vertical conductive lines coupled to the row of memory cells 101 may be connected to a first wiring line 140, while all of the second vertical conductive lines coupled to the row of memory cells may be connected to a second wiring line 142. Depending on the mode of operation for the memory cell 100 as will be discussed later, same or different voltages may be applied to the first and second wiring lines 140 and 142. Alternatively, both the first and second vertical conductive lines coupled to the row of memory cells 101 may be connected to a common wiring line (not shown).

Figures 5A, 5B:
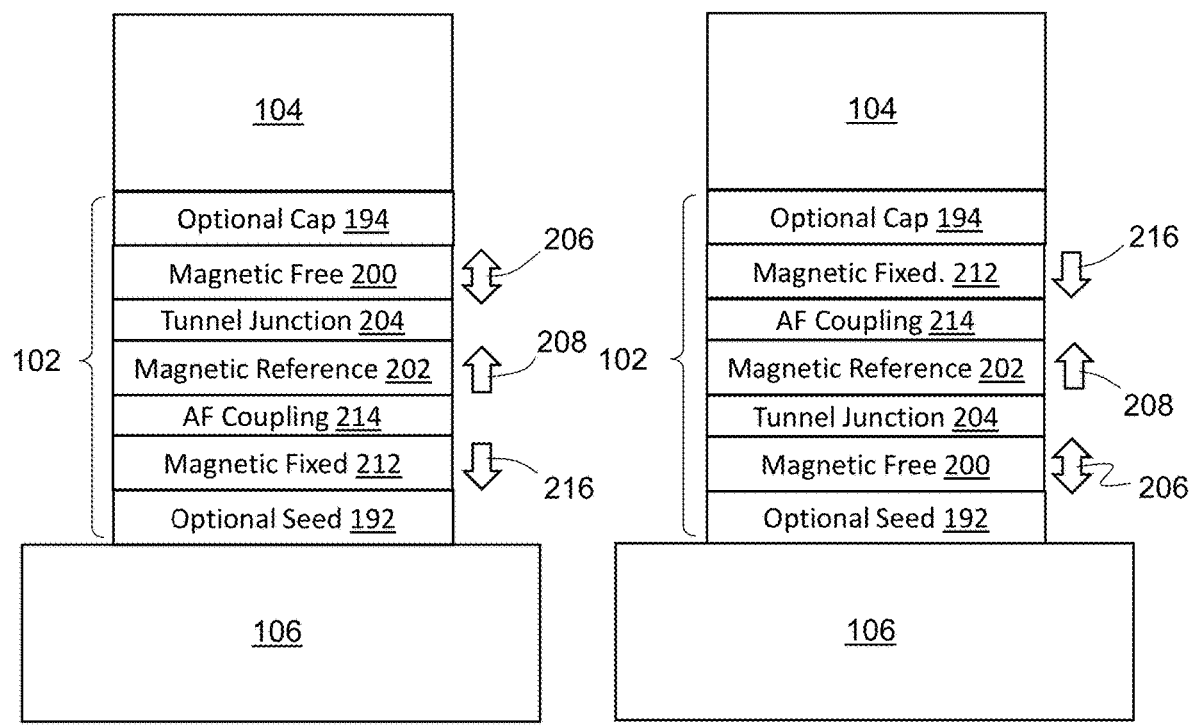
FIGS. 5A and 5B are cross sectional views of exemplary structures for a magnetic memory element in accordance with an embodiment of the present invention.

FIG. 5A shows an exemplary structure for the magnetic memory element 102 that includes a magnetic free layer structure 200 and a magnetic reference layer structure 202 with a tunnel junction layer 204 interposed therebetween. The magnetic free layer structure 200, which is formed beneath the horizontal conductive line 104, has a variable magnetization direction 206 substantially perpendicular to the layer plane thereof. The magnetic reference layer structure 202 has a first invariable magnetization direction 208 substantially perpendicular to the layer plane thereof. The magnetic free layer structure 200, the tunnel junction layer 204, and the magnetic reference layer structure 202 collectively form a magnetic tunnel junction (MTJ). The exemplary structure of FIG. 5A may further include a magnetic fixed layer structure 212 exchange coupled to the magnetic reference layer structure 202 through an anti-ferromagnetic coupling layer 214. The magnetic fixed layer structure 212, which is formed on top of the bottom electrode 106, has a second invariable magnetization direction 216 that is substantially perpendicular to the layer plane thereof and is substantially opposite to the first invariable magnetization direction 208 of the magnetic reference layer structure 202. In an embodiment, the stray magnetic fields exerted on the magnetic free layer structure 200 by the magnetic reference and fixed layer structures 202 and 212, respectively, substantially cancel each other, thereby rendering the offset field to be substantially zero or negligible. An optional seed layer 192 may form between the magnetic fixed layer structure 212 and the bottom electrode 106; and an optional cap layer 194 may form between the magnetic free layer structure 200 and the horizontal conductive line 104. The stacking order of the layers 212, 214, 202, 204, and 200 in the exemplary structure of FIG. 5A may be inverted as shown in FIG. 5B. In the exemplary structure of FIG. 5B, the magnetic fixed layer structure 212 and the magnetic free layer structure 200 are formed adjacent to the horizontal conductive line 104 and the bottom electrode 106, respectively.

Figure 6A:
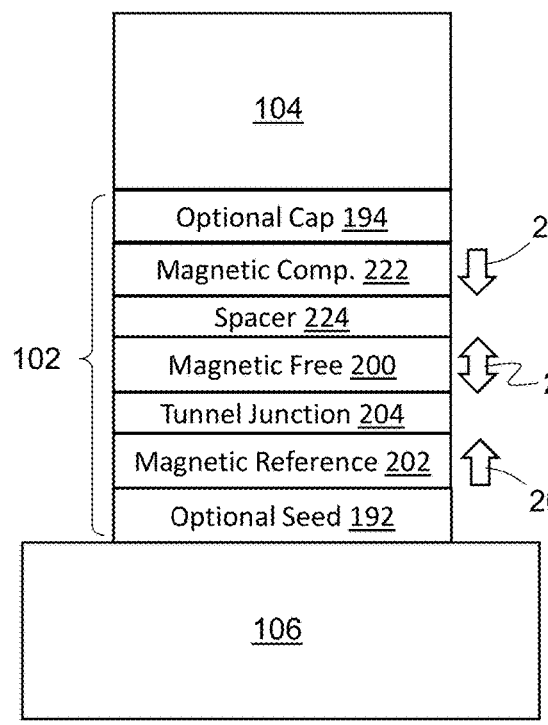
FIGS. 6A and 6B are cross sectional views of exemplary structures for a magnetic memory element in accordance with another embodiment of the present invention.
Figure 6B:
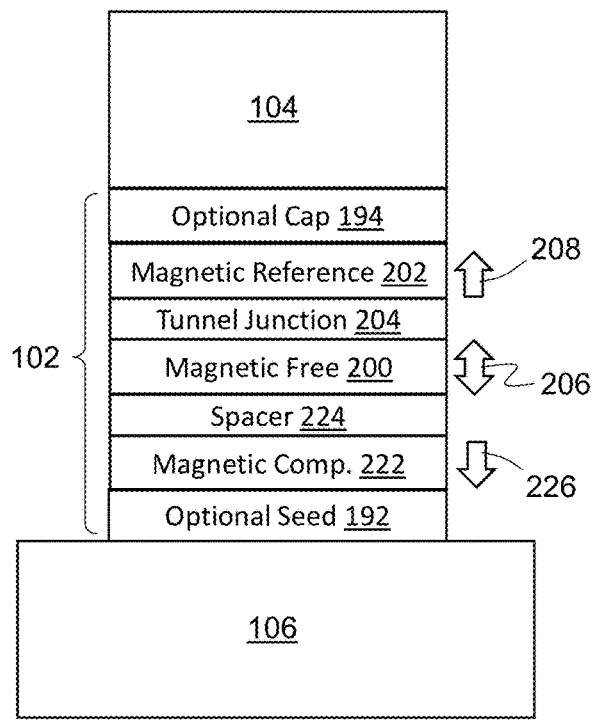

FIG. 6A shows another exemplary structure for the magnetic memory element 102 that includes a magnetic free layer structure 200 and a magnetic reference layer structure 202 with a tunnel junction layer 204 interposed therebetween; and a magnetic compensation layer structure 222 separated from the magnetic free layer structure 200 by a non-magnetic spacer layer 224. The magnetic reference layer structure 202 is formed on top of the bottom electrode 106. The magnetic compensation layer structure 222, which is formed beneath the horizontal conductive line 104, has a third invariable magnetization direction 226 that is substantially perpendicular to the layer plane thereof and is substantially opposite to the first invariable magnetization direction 208 of the magnetic reference layer structure 202. The magnetic compensation layer structure 222 may be used to generate a magnetic field opposing that exerted by the magnetic fixed layer structure 202 on the magnetic free layer structure 200. In an embodiment, the stray magnetic fields exerted on the magnetic free layer structure 200 by the magnetic reference and compensation layer structures 202 and 222, respectively, substantially cancel each other, thereby rendering the offset field to be substantially zero or negligible. An optional seed layer 192 may form between the magnetic reference layer structure 202 and the bottom electrode 106; and an optional cap layer 194 may form between the magnetic compensation layer structure 222 and the horizontal conductive line 104. The stacking order of the layers 202, 204, 200, 224, and 222 in the exemplary structure of FIG. 6A may be inverted as shown in FIG. 6B. In the exemplary structure of FIG. 6B, the magnetic reference layer structure 202 and the magnetic compensation layer structure 222 are formed adjacent to the horizontal conductive line 104 and the bottom electrode 106, respectively.

Figure 7A:
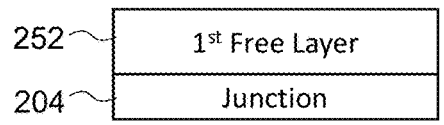
FIGS. 7A-7G are cross sectional views showing exemplary structures for the magnetic free layer structure.

The magnetic free layer structure 200 of the exemplary structures of FIGS. 5A, 5B, 6A, and 6B may include one or more magnetic layers with each layer having the variable magnetization direction 206 as illustrated by the exemplary embodiments shown in FIGS. 7A-7G. FIG. 7A shows that the magnetic free layer structure 200 includes a first magnetic free layer 252, which has the variable magnetization direction 206, formed adjacent to the tunnel junction layer 204.

Figure 7B:
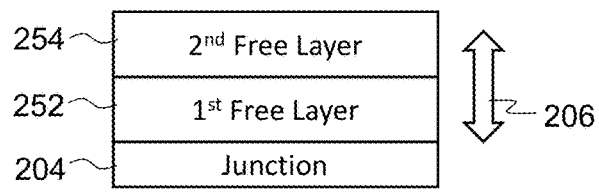

FIG. 7B shows the magnetic free layer structure 200 including a first magnetic free layer 252 formed adjacent to the tunnel junction layer 204 and a second magnetic free layer 254 formed adjacent to the first magnetic free layer 252 opposite the tunnel junction layer 204. Each of the first and second magnetic free layers 252 and 254 has the variable magnetization direction 206. The exemplary magnetic free layer structure of FIG. 7B may further include a non-magnetic perpendicular enhancement layer (PEL) 258 interposed between the first and second magnetic free layers 252 and 254 as illustrated in FIG. 7D.

Figure 7C:
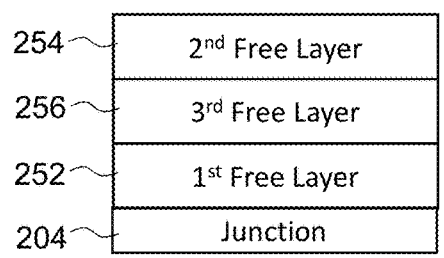
Figure 7D:
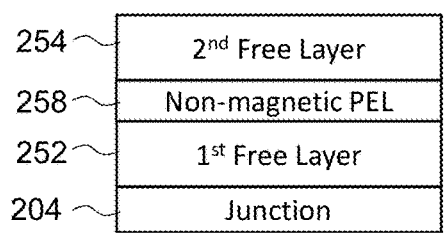

The magnetic free layer structure 200 may include three magnetic free layers 252-256 as illustrated in FIG. 7C. A first magnetic free layer 252 is formed adjacent to the tunnel junction layer 204. A third magnetic free layer 256 is formed adjacent to the first magnetic free layer 252 opposite the tunnel junction layer 204. A second magnetic free layer 254 is formed adjacent to the third magnetic free layer 256 opposite the first magnetic free layer 252. Each of the first, second, and third magnetic free layers 252-256 has the variable magnetization direction 206.

Figure 7E:
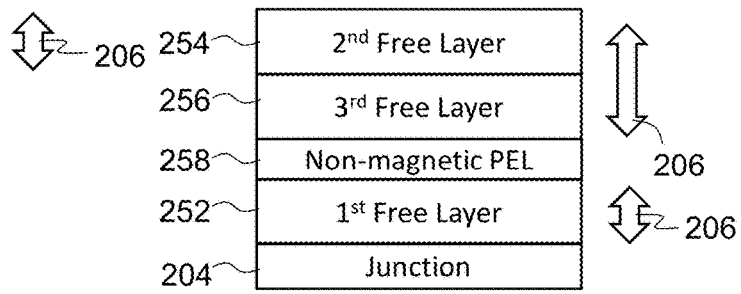
Figure 7F:
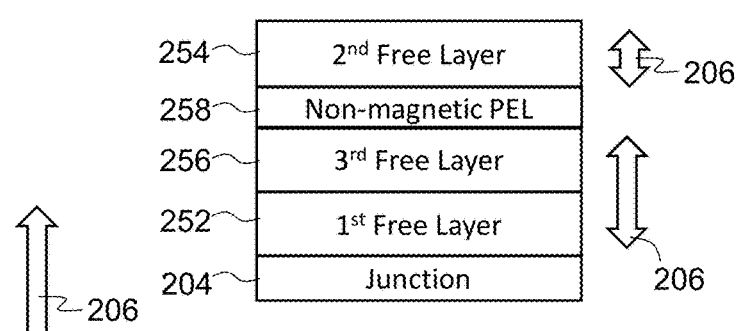
Figure 7G:
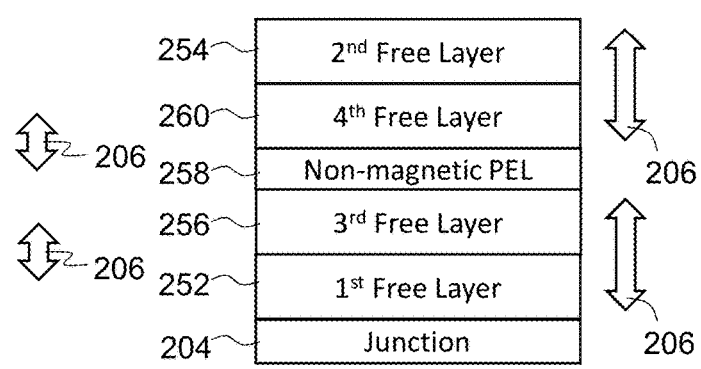

The exemplary magnetic free layer structure of FIG. 7C may further include a non-magnetic perpendicular enhancement layer (PEL) 258 interposed between the first and third magnetic free layers 252 and 256 as illustrated in FIG. 7E. Alternatively, the exemplary magnetic free layer structure of FIG. 7C may further include a non-magnetic perpendicular enhancement layer (PEL) 258 interposed between the second and third magnetic free layers 254 and 256 as illustrated in FIG. 7F. The exemplary magnetic free layer structure of FIG. 7F may be further modified to include a fourth magnetic free layer 260, which has the variable magnetization direction 206, interposed between the non-magnetic PEL 258 and the second magnetic free layer 254 as illustrated in FIG. 7G.

The exemplary magnetic free layer structures of FIGS. 7A-7G may be formed above the tunnel junction layer 204 as shown in FIGS. 5A and 6A, or beneath the tunnel junction layer 204 as shown in FIGS. 5B and 6B. In the latter case, the stacking sequence of the layers in the exemplary magnetic free layer structures of FIGS. 7A-7G will be inverted.

The magnetic free layer structure 200 is not limited to the exemplary structures of FIGS. 7A-7G and may have other structures that include multiple magnetic free layers and optionally one or more PELs. For example and without limitation, the magnetic free layer structure 200 may include four magnetic free layers without any PEL.

Figure 8A:
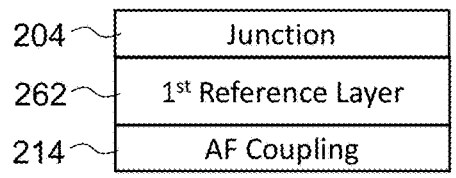
FIGS. 8A-8G are cross sectional views showing exemplary structures for the magnetic reference layer structure.

The magnetic reference layer structure 202 of the exemplary structures of FIGS. 5A, 5B, 6A, and 6B may include one or more magnetic layers with each layer having the first invariable magnetization direction 208 as illustrated by the exemplary embodiments shown in FIGS. 8A-8G. FIG. 8A shows that the magnetic reference layer structure 202 includes a first magnetic reference layer 262, which has the first invariable magnetization direction 208, formed between the tunnel junction layer 204. The anti-ferromagnetic coupling layer 214, if present, may form adjacent to the first magnetic reference layer 262.

Figure 8B:
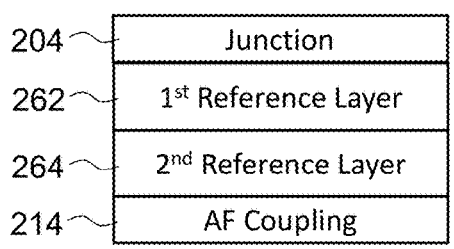

FIG. 8B shows the magnetic reference layer structure 202 including a first magnetic reference layer 262 formed adjacent to the tunnel junction layer 204 and a second magnetic reference layer 264 formed adjacent to the first magnetic reference layer 262 opposite the tunnel junction layer 204. The anti-ferromagnetic coupling layer 214, if present, may form adjacent to the second magnetic reference layer 264 opposite the first magnetic reference layer 262. Each of the first and second magnetic reference layers 262 and 264 has the first invariable magnetization direction 208. The exemplary magnetic reference layer structure of FIG. 8B may further include a non-magnetic perpendicular enhancement layer (PEL) 268 interposed between the first and second magnetic reference layers 262 and 264 as illustrated in FIG. 8D.

Figure 8C:
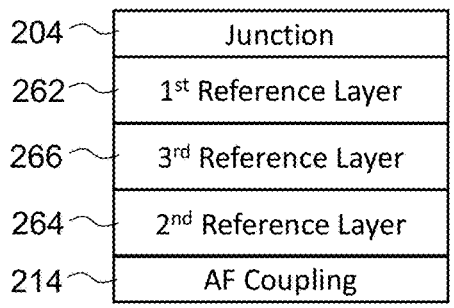
Figure 8D:
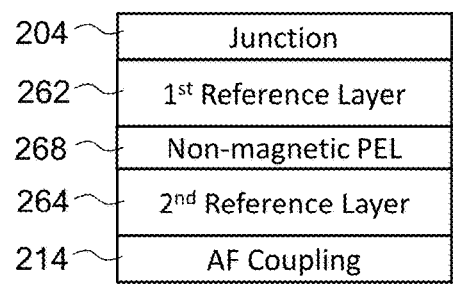

The magnetic reference layer structure 202 may include three magnetic reference layers 262-266 as illustrated in FIG. 8C. A first magnetic reference layer 262 is formed adjacent to the tunnel junction layer 204. A third magnetic reference layer 266 is formed adjacent to the first magnetic reference layer 262 opposite the tunnel junction layer 204. A second magnetic reference layer 264 is formed adjacent to the third magnetic reference layer 266 opposite the first magnetic reference layer 262. The anti-ferromagnetic coupling layer 214, if present, may form adjacent to the second magnetic reference layer 264 opposite the third magnetic reference layer 266. Each of the first, second, and third magnetic reference layers 262-266 has the first invariable magnetization direction 208.

Figure 8E:
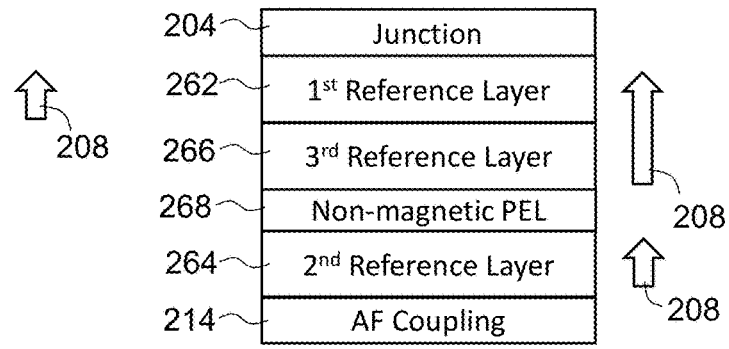
Figure 8F:
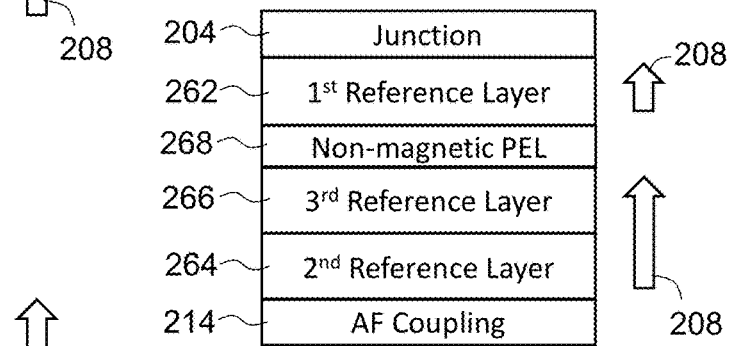
Figure 8G:
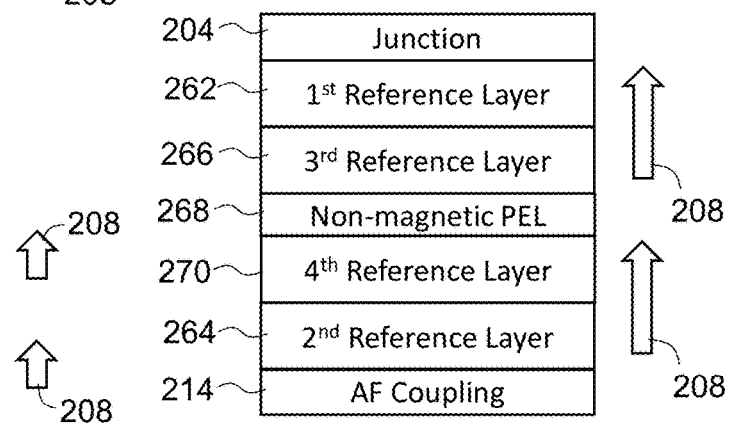

The exemplary magnetic reference layer structure of FIG. 8C may further include a non-magnetic perpendicular enhancement layer (PEL) 268 interposed between the first and third magnetic reference layers 262 and 266 as illustrated in FIG. 8F. Alternatively, the exemplary magnetic reference layer structure of FIG. 8C may further include a non-magnetic perpendicular enhancement layer (PEL) 268 interposed between the second and third magnetic reference layers 264 and 266 as illustrated in FIG. 8E. The exemplary magnetic reference layer structure of FIG. 8E may be further modified to include a fourth magnetic reference layer 270, which has the first invariable magnetization direction 208, interposed between the non-magnetic PEL 268 and the second magnetic reference layer 264 as illustrated in FIG. 8G.

The exemplary magnetic reference layer structures of FIGS. 8A-8G may be formed beneath the tunnel junction layer 204 as shown in FIGS. 5A and 6A, or above the tunnel junction layer 204 as shown in FIGS. 5B and 6B. In the latter case, the stacking sequence of the layers in the exemplary magnetic reference layer structures of FIGS. 8A-8G will be inverted.

The magnetic reference layer structure 202 is not limited to the exemplary structures of FIGS. 8A-8G and may have other structures that include multiple magnetic reference layers and optionally one or more PELs. For example and without limitation, the magnetic reference layer structure 202 may include four magnetic reference layers without any PEL.

Figure 9A:
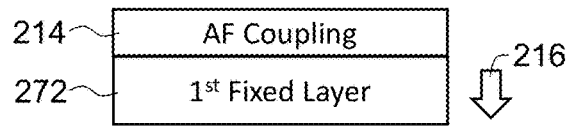
FIGS. 9A-9G are cross sectional views showing exemplary structures for the magnetic fixed layer structure.

The magnetic fixed layer structure 212 of the exemplary structures of FIGS. 5A and 5B may include one or more magnetic layers with each layer having the second invariable magnetization direction 216 as illustrated by the exemplary embodiments shown in FIGS. 9A-9G. FIG. 9A shows that the magnetic fixed layer structure 212 includes a first magnetic fixed layer 272, which has the second invariable magnetization direction 216, formed adjacent to the anti-ferromagnetic coupling layer 214.

Figure 9B:
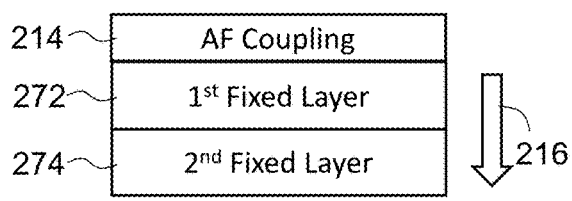

FIG. 9B shows the magnetic fixed layer structure 212 including a first magnetic fixed layer 272 formed adjacent to the anti-ferromagnetic coupling layer 214 and a second magnetic fixed layer 274 formed adjacent to the first magnetic fixed layer 272 opposite the anti-ferromagnetic coupling layer 214. Each of the first and second magnetic fixed layers 272 and 274 has the second invariable magnetization direction 216. The exemplary magnetic fixed layer structure of FIG. 9B may further include a non-magnetic perpendicular enhancement layer (PEL) 278 interposed between the first and second magnetic fixed layers 272 and 274 as illustrated in FIG. 9D.

Figure 9C:
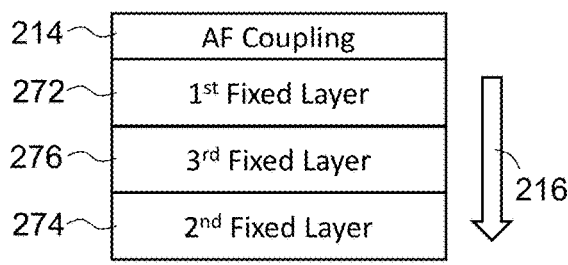
Figure 9D:
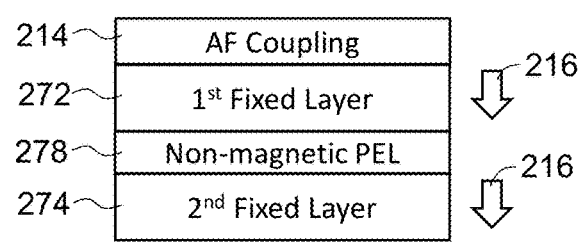

The magnetic fixed layer structure 212 may include three magnetic fixed layers 272-276 as illustrated in FIG. 9C. A first magnetic fixed layer 272 is formed adjacent to the anti-ferromagnetic coupling layer 214. A third magnetic fixed layer 276 is formed adjacent to the first magnetic fixed layer 272 opposite the anti-ferromagnetic coupling layer 214. A second magnetic fixed layer 274 is formed adjacent to the third magnetic fixed layer 276 opposite the first magnetic fixed layer 272. Each of the first, second, and third magnetic fixed layers 272-276 has the second invariable magnetization direction 216.

Figure 9E:
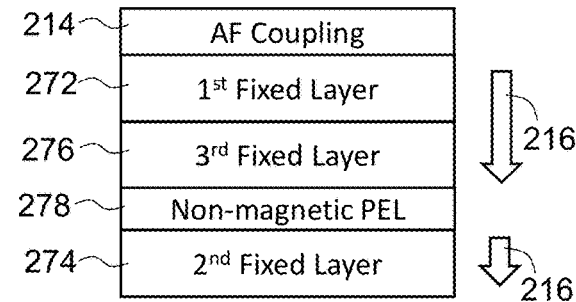
Figure 9F:
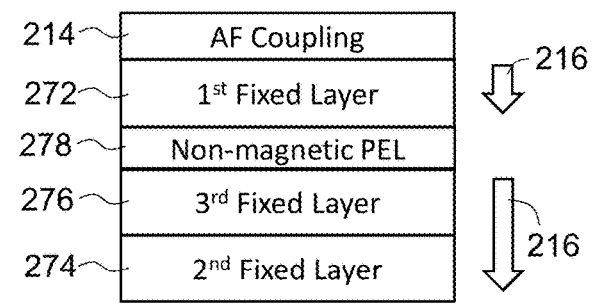
Figure 9G:
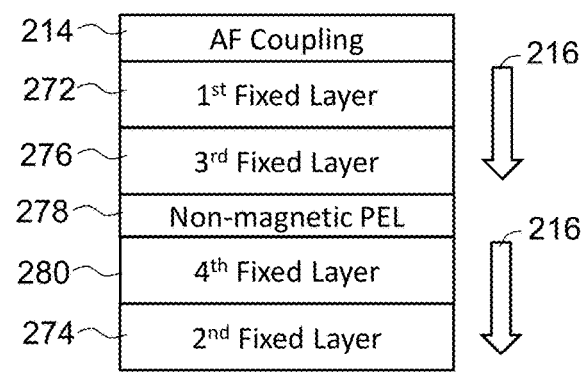

The exemplary magnetic fixed layer structure of FIG. 9C may further include a non-magnetic perpendicular enhancement layer (PEL) 278 interposed between the first and third magnetic fixed layers 272 and 276 as illustrated in FIG. 9F. Alternatively, the exemplary magnetic fixed layer structure of FIG. 9C may further include a non-magnetic perpendicular enhancement layer (PEL) 278 interposed between the second and third magnetic fixed layers 274 and 276 as illustrated in FIG. 9E. The exemplary magnetic fixed layer structure of FIG. 9E may be further modified to include a fourth magnetic fixed layer 280, which has the second invariable magnetization direction 216, interposed between the non-magnetic PEL 278 and the second magnetic fixed layer 274 as illustrated in FIG. 9G.

The exemplary magnetic fixed layer structures of FIGS. 9A-9G may be formed beneath the anti-ferromagnetic coupling layer 214 as shown in FIG. 5A, or above the anti-ferromagnetic coupling layer 214 as shown in FIG. 5B. In the latter case, the stacking sequence of the layers in the exemplary magnetic fixed layer structures of FIGS. 9A-9G will be inverted.

The magnetic fixed layer structure 212 is not limited to the exemplary structures of FIGS. 9A-9G and may have other structures that include multiple magnetic fixed layers and optionally one or more PELs. For example and without limitation, the magnetic fixed layer structure 212 may include four magnetic fixed layers without any PEL.

Figure 10A:
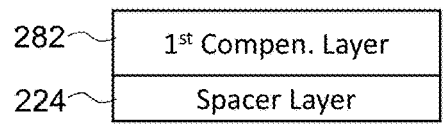
FIGS. 10A-10G are cross sectional views showing exemplary structures for the magnetic compensation layer structure.

The magnetic compensation layer structure 222 of the exemplary structures of FIGS. 6A and 6B may include one or more magnetic layers with each layer having the third invariable magnetization direction 226 as illustrated by the exemplary structures shown in FIGS. 10A-10G. FIG. 10A shows that the magnetic compensation layer structure 222 includes a first magnetic compensation layer 282, which has the third fixed magnetization direction 226, formed adjacent to the spacer layer 224.

Figure 10B:
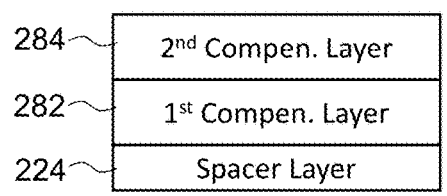

FIG. 10B shows the magnetic compensation layer structure 222 including a first magnetic compensation layer 282 formed adjacent to the spacer layer 224 and a second magnetic compensation layer 284 formed adjacent to the first magnetic compensation layer 282 opposite the spacer layer 224. Each of the first and second magnetic compensation layers 282 and 284 has the third invariable magnetization direction 226. The exemplary magnetic compensation layer structure of FIG. 21B may further include a non-magnetic perpendicular enhancement layer (PEL) 288 interposed between the first and second magnetic compensation layers 282 and 284 as illustrated in FIG. 10D.

Figure 10C:
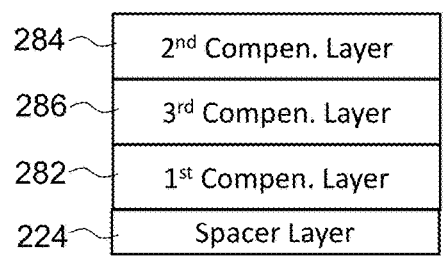
Figure 10D:
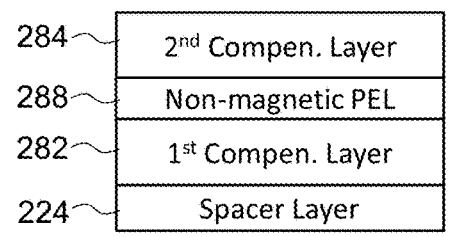

The magnetic compensation layer structure 222 may include three magnetic compensation layers 282-286 as illustrated in FIG. 10C. A first magnetic compensation layer 282 is formed adjacent to the spacer layer 224. A third magnetic compensation layer 286 is formed adjacent to the first magnetic compensation layer 282 opposite the spacer layer 224. A second magnetic compensation layer 284 is formed adjacent to the third magnetic compensation layer 286 opposite the first magnetic compensation layer 282. Each of the first, second, and third magnetic compensation layers 282-286 has the third invariable magnetization direction 226.

Figure 10E:
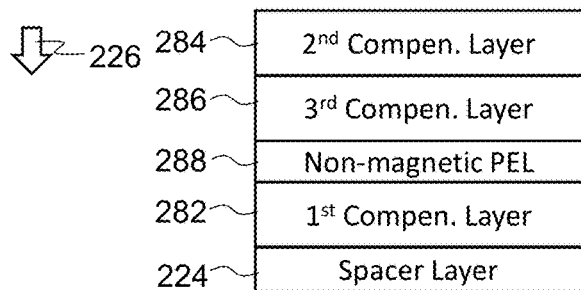
Figure 10F:
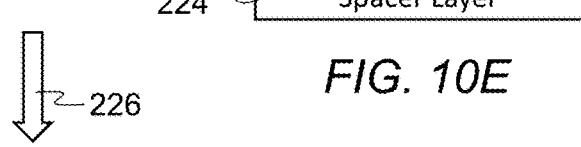
Figure 10G:
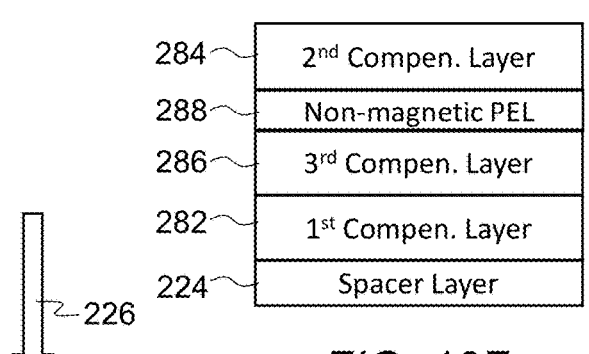

The exemplary magnetic compensation layer structure of FIG. 10C may further include a non-magnetic perpendicular enhancement layer (PEL) 288 interposed between the first and third magnetic compensation layers 282 and 286 as illustrated in FIG. 10E. Alternatively, the exemplary magnetic compensation layer structure of FIG. 10C may further include a non-magnetic perpendicular enhancement layer (PEL) 288 interposed between the second and third magnetic compensation layers 284 and 286 as illustrated in FIG. 10F. The exemplary magnetic compensation layer structure of FIG. 10F may be further modified to include a fourth magnetic compensation layer 290, which has the third invariable magnetization direction 226, interposed between the non-magnetic PEL 288 and the second magnetic compensation layer 284 as illustrated in FIG. 10G.

The exemplary magnetic compensation layer structures of FIGS. 10A-10G may be formed above the spacer layer 224 as shown in FIG. 6A, or beneath the spacer layer 224 as shown in FIG. 6B. In the latter case, the stacking sequence of the layers in the exemplary magnetic free layer structures of FIG. 10A-10G will be inverted.

The magnetic compensation layer structure 222 is not limited to the exemplary structures of FIGS. 10A-10G and may have other structures that include multiple magnetic compensation layers and optionally one or more PELs. For example and without limitation, the magnetic compensation layer structure 222 may include four magnetic compensation layers without any PEL.

The magnetic layers 252-256, 260-266, 270-276, 280-286, and 290 may be made of any suitable magnetic materials or structures. One or more of the magnetic layers 252-256, 260-266, 270-276, 280-286, and 290 each may comprise one or more ferromagnetic elements, such as but not limited to cobalt (Co), nickel (Ni), and iron (Fe), to form a suitable magnetic material, such as but not limited to Co, Ni, Fe, $CoNi_x$, $CoFe_x$, $NiFe_x$, or $CoNi_xFe_y$. The suitable magnetic material for the one or more of the magnetic layers 252-256, 260-266, 270-276, 280-286, and 290 may further include one or more non-magnetic elements, such as but not limited to boron (B), titanium (Ti), zirconium (Zr), hafnium (Hf), vanadium (V), niobium (Nb), tantalum (Ta), chromium (Cr), molybdenum (Mo), tungsten (W), aluminum (Al), silicon (Si), germanium (Ge), gallium (Ga), oxygen (O), nitrogen (N), carbon (C), platinum (Pt), palladium (Pd), ruthenium (Ru), samarium (Sm), neodymium (Nd), antimony (Sb), iridium (Ir) or phosphorus (P), to form a magnetic alloy or compound, such as but not limited to cobalt-iron-boron ($CoFe_xB_y$), iron-platinum ($FePt_x$), cobalt-platinum ($CoPt_x$), cobalt-platinum-chromium ($CoPt_xCr_y$), cobalt-iron-boron-titanium ($CoFe_xB_yTi_z$), cobalt-iron-boron-zirconium, ($CoFe_xB_yZr_z$), cobalt-iron-boron-hafnium ($CoFe_xB_yHf_z$), cobalt-iron-boron-vanadium ($CoFe_xB_yV_z$), cobalt-iron-boron-tantalum ($CoFe_xB_yTa_z$), cobalt-iron-boron-chromium ($CoFe_xB_yCr_z$), cobalt-iron-titanium ($CoFe_xTi_y$), cobalt-iron-zirconium ($CoFe_xZr_y$), cobalt-iron-hafnium ($CoFe_xHf_y$), cobalt-iron-vanadium ($CoFe_xV_y$), cobalt-iron-niobium ($CoFe_xNb_y$), cobalt-iron-tantalum ($CoFe_xTa_y$), cobalt-iron-chromium ($CoFe_xCr_y$), cobalt-iron-molybdenum ($CoFe_xMo_y$), cobalt-iron-tungsten ($CoFe_xW_y$), cobalt-iron-aluminum ($CoFe_xAl_y$), cobalt-iron-silicon ($CoFe_xSi_y$), cobalt-iron-germanium ($CoFe_xGe_y$), iron-zirconium-boron ($FeZr_xB_y$), samarium-cobalt ($SmCo_x$), neodymium-iron-boron ($NdFe_xB_y$), cobalt-iron-antimony ($CoFe_xSb_y$), cobalt-iron-iridium ($CoFe_xIr_y$), or cobalt-iron-phosphorous ($CoFe_xP_y$).

Some of the above-mentioned magnetic materials, such as Fe, $CoFe_x$, $CoFe_xB_y$ may have a body-centered cubic (BCC) lattice structure that is compatible with the halite-like cubic lattice structure of $MgO_x$, which may be used as the insulating tunnel junction layer 204. $CoFe_xB_y$ alloy used for one or more of the magnetic layers 252-256, 260-266, 270-276, 280-286, and 290 may contain more than 40 atomic percent Fe or may contain less than 30 atomic percent B or both.

Figure 11A:
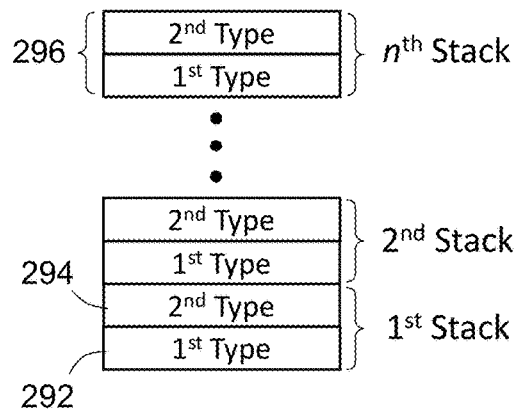
FIGS. 11A-11D are cross sectional views showing exemplary multilayer structures comprising one or more stacks of a bilayer unit structure.
Figure 11C:
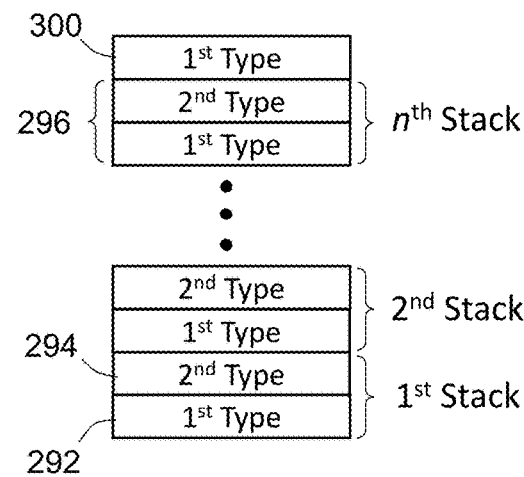
Figure 11B:
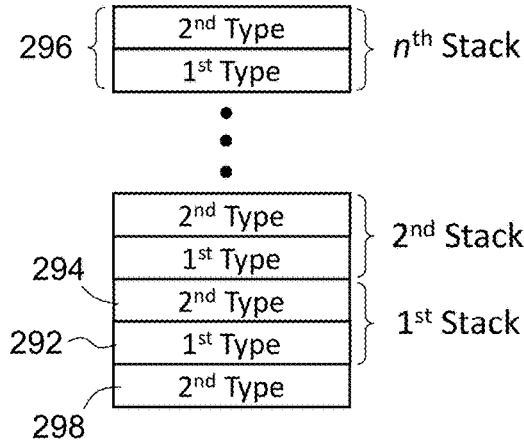
Figure 11D:
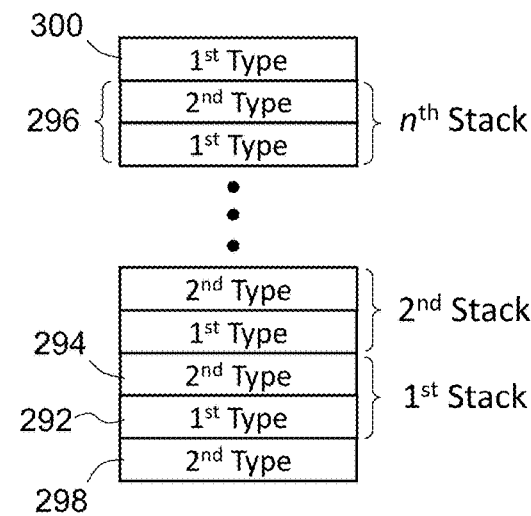

One or more of the magnetic layers 252-256, 260-266, 270-276, 280-286, and 290 each may alternatively have a multilayer structure formed by interleaving one or more layers of a first type of material 292 with one or more layers of a second type of material 294 with at least one of the two types of materials 292 and 294 being magnetic, as illustrated in FIGS. 11A-11D. FIG. 11A shows an exemplary multilayer structure formed by one (n=1) or more stacks of a bilayer unit structure 296, which includes a layer of the first type of material 292 and a layer of the second type of material 294. The multilayer structure for one or more of the magnetic layers 252-256, 260-266, 270-276, 280-286, and 290 may include additional layers formed at the periphery of the exemplary multilayer structure of FIG. 11A. For example and without limitation, the stacks of the bilayer unit structure 296 may include another layer of the second type of material 298 formed adjacent to the first type of material of the first stack as shown in FIG. 11B, or another layer of the first type of material 300 formed adjacent to the second type of material of the $n^{th}$ stack (the end stack) as shown in FIG. 11C, or both as shown in FIG. 11D. The layer of the first type of material 292 in a unit structure 296 may have a different thickness compared with other layers of the first type of material in other unit structures. Similarly, the layer of the second type of material 294 in a unit structure 296 may have a different thickness compared with other layers of the second type of material in other unit structures. The layer thicknesses of the first type of material 300 and the second type of material 298 at the periphery may or may not be same as the layer thicknesses of the first type of material 292 and the second type of material 294 of the bilayer unit structure 296, respectively. One or more layers of the two layers of materials 292-294 may be extremely thin and thus have fragmented coverage and/or are perforated with holes. The stacking sequences of the exemplary multilayer structures of FIGS. 11A-11D may be inverted.

The first type of material 292 and 300 may comprise one or more ferromagnetic elements, such as but not limited to cobalt (Co), nickel (Ni), and iron (Fe), to form a suitable magnetic material, such as but not limited to Co, Ni, Fe, $CoNi_x$, $CoFe_x$, $NiFe_x$, or $CoNi_xFe_y$. The second type of material 294 and 298 may be made of any suitable material, such as but not limited to Pt, Pd, Ni, Ir, Cr, V, Ti, Zr, Hf, Nb, Ta, Mo, W, $NiCr_x$, $NiV_x$, $NiTi_x$, $NiZr_x$, $NiHf_x$, $NiNb_x$, $NiTa_x$, $NiMo_y$, $NiW_x$, or any combination thereof. Therefore, one or more of the magnetic layers 252-256, 260-266, 270-276, 280-286, and 290 may include a multilayer structure, such as but not limited to [Co/Pt], [Co/Pd], [Co/Pt(Pd)], [Co/Ni], [Co/Ir], [$CoFe_x$/Pt], [$CoFe_x$/Pd], [$CoFe_x$/Pt(Pd)], [$CoFe_x$/Ni], [$CoFe_x$/Ir], [Co/$NiCr_x$], or any combination thereof. The multilayer structure may have a face-centered cubic (FCC) type of lattice structure, which is different from the body-centered cubic structure (BCC) of some ferromagnetic materials, such as Fe, $CoFe_x$, and $CoFe_xB_y$, and the halite-like cubic lattice structure of magnesium oxide ($MgO_x$) that may be used as the insulating tunnel junction layer 204. All individual magnetic layers of a magnetic multilayer structure may have the same magnetization direction. The multilayer structure may or may not exhibit the characteristic satellite peaks associated with superlattice when analyzed by X-ray, neutron diffraction, or other diffraction techniques.

The insulating tunnel junction layer 204 of the exemplary structures of FIGS. 5A, 5B, 6A, and 6B may be formed of a suitable insulating material containing oxygen, nitrogen, or both, such as but not limited to magnesium oxide $(MgO)_x$, aluminum oxide $(AlO_x)$, titanium oxide $(TiO_x)$, zirconium oxide $(ZrO_x)$, hafnium oxide $(HfO_x)$, vanadium oxide $(VO_x)$, tantalum oxide $(TaO_x)$, chromium oxide $(CrO_x)$, molybdenum oxide $(MoO_x)$, tungsten oxide (WOO, gallium oxide $(GaO_x)$, silicon oxide $(SiO_x)$, yttrium oxide $(YO_x)$, silicon nitride $(SiN_x)$, $MgTi_xO_y$, $MgAl_xO_y$, $AlTi_xO_y$, or any combination thereof. The insulating tunnel junction layer 204 may have a composite structure comprising two layers of insulating materials, each of which is made of a suitable insulating material as described above. For example and without limitation, the composite tunnel junction layer may include a layer of magnesium oxide and a layer of titanium oxide.

The anti-ferromagnetic coupling layer 214, which anti-ferromagnetically couples the magnetic fixed layer structure 212 to the magnetic reference layer structure 202 of the exemplary structures of FIGS. 5A and 5B, may be made of a suitable coupling material, such as but not limited to ruthenium (Ru), vanadium (V), niobium (Nb), tantalum (Ta), chromium (Cr), molybdenum (Mo), tungsten (W), manganese (Mn), rhenium (Re), osmium (Os), rhodium (Rh), iridium (Ir), copper (Cu), or any combination thereof. The anti-ferromagnetic coupling layer 214 may have a composite structure that includes two or more sublayers. Each of the sublayers may be made of a suitable coupling material described above.

The perpendicular enhancement layers (PELs) 258, 268, 278, and 288 each may comprise one or more of the following elements: B, Mg, Ti, Zr, Hf, V, Nb, Ta, Cr, Mo, W, Mn, Re, Fe, Ru, Os, Co, Rh, Ir, Ni, Pd, Pt, Cu, Ag, Au, Al, Si, Ge, Ga, O, N, and C, thereby forming a suitable perpendicular enhancement material, such as but not limited to B, Mg, Ti, Zr, Hf, V, Nb, Ta, Cr, Mo, W, Mn, Re, Fe, Ru, Os, Co, Rh, Ir, Ni, Pd, Pt, Cu, Ag, Au, Al, Si, Ge, Ga, $MgO_x$, $TiO_x$, $ZrO_x$, $HfO_x$, $VO_x$, $NbO_x$, $TaO_x$, $CrO_x$, $MoO_x$, $WO_x$, $RhO_x$, $NiO_x$, $PdO_x$, $PtO_x$, $CuO_x$, $AgO_x$, $RuO_x$, $SiO_x$, $TiN_x$, $ZrN_x$, $HfN_x$, $VN_x$, $NbN_x$, $TaN_x$, $CrN_x$, $MoN_x$, $WN_x$, $NiN_x$, $PdN_x$, $PtN_x$, $RuN_x$, $SiN_x$, $TiON_y$, $ZrO_xN_y$, $HfO_xN_y$, $VO_xN_y$, $NbO_xN_y$, $TaO_xN_y$, $CrO_xN_y$, $MoO_xN_y$, $WO_xN_y$, $NiO_xN_y$, $PdO_xN_y$, $PtON_y$, $RuO_xN_y$, $SiO_xN_y$, $TiRu_xO_y$, $ZrRu_xO_y$, $HfRu_xO_y$, $VRu_xO_y$, $NbRu_xO_y$, $TaRu_xO_y$, $CrRu_xO_y$, $MoRu_xO_y$, $WRu_xO_y$, $RhRu_xO_y$, $NiRu_xO_y$, $PdRu_xO_y$, $PtRu_xO_y$, $CuRu_xO_y$, $AgRu_xO_y$, $CoFe_xB_y$, $CoFe_x$, $NiFe_x$, $CoFeNi_y$, $CoTi_x$, $CoZr_x$, $CoHf_x$, $CoV_x$, $CoNb_x$, $CoTa_x$, $CoFe_xTa_y$, $CoCr_x$, $CoMo_x$, $CoW_x$, $NiCr_x$, $NiTi_x$, $NiZr_x$, $NiHf_x$, $NiV_x$, $NiNb_x$, $NiTa_x$, $NiMo_y$, $NiW_x$, $CoNi_xTa_y$, $CoNi_xCr_y$, $CoNi_xTi_y$, $FeTi_x$, $FeZr_x$, $FeHf_x$, $FeV_x$, $FeNb_x$, $FeTa_x$, $FeCr_x$, $FeMo_x$, $FeW_x$, or any combination thereof. In cases where the perpendicular enhancement material contains one or more ferromagnetic elements, such as Co, Fe, and Ni, the total content of the ferromagnetic elements of the perpendicular enhancement material may be less than the threshold required for becoming magnetic, thereby rendering the material essentially non-magnetic. Alternatively, the perpendicular enhancement material that contains one or more ferromagnetic elements may be very thin, thereby rendering the material paramagnetic or magnetically dead. One or more of the PELs 258, 268, 278, and 288 may alternatively have a multilayer structure comprising two or more layers of perpendicular enhancement sublayers, each of which is made of a suitable perpendicular enhancement material described above. For example and without limitation, one or more of the PELs 258, 268, 278, and 288 may have a bilayer structure, such as but not limited to W/Ta, Ta/W, Mo/Ta, Ta/Mo, W/Hf, Hf/W, Mo/Hf, or Hf/Mo.

The optional seed layer 192 of the exemplary structures of FIGS. 5A, 5B, 6A, and 6B, if present, may have a single layer structure or may comprise two, three, four, or more sublayers formed adjacent to each other. One or more of the single layer and the multiple sublayers of the seed layer 192 comprise one or more of the following elements: B, Mg, Ti, Zr, Hf, V, Nb, Ta, Cr, Mo, W, Mn, Re, Fe, Ru, Os, Co, Rh, Ir, Ni, Pd, Pt, Cu, Ag, Au, Al, Si, Ge, Ga, O, N, and C. For example, the seed layer 192 may include a layer of $MgO_x$, Ta, Hf, W, Mo, Ru, Pt, Pd, $NiCr_x$, $NiTa_x$, $NiTi_x$, or $TaN_x$. Alternatively, the seed layer 192 may include a bilayer structure (Ru/Ta) comprising a Ta sublayer formed adjacent to one of the magnetic layers 212 and 202 and a Ru sublayer formed beneath the Ta sublayer. Other exemplary bilayer structures (bottom/top), such as Ta/Ru, Ta/Hf, Hf/Ta, Ta/W, W/Ta, W/Hf, Hf/W, Mo/Ta, Ta/Mo, Mo/Hf, Hf/Mo, Ru/W, W/Ru, $MgO_x$/Ta, Ta/$MgO_x$, Ru/$MgO_x$, Hf/$MgO_x$, and W/$MgO_x$, may also be used for the seed layer 192. Still alternatively, the seed layer 192 may include a bilayer structure comprising an oxide sublayer, such as $MgO_x$, formed adjacent to one of the magnetic layers 212 and 202 and an underlying, thin conductive sublayer, such as $CoFe_xB_y$, which may be non-magnetic or amorphous or both. Additional seed sublayers may further form beneath the exemplary $CoFe_xB_y$/$MgO_x$ seed layer to form other seed layer structures, such as but not limited to Ru/$CoFe_xB_y$/$MgO_x$, Ta/$CoFe_xB_y$/$MgO_x$, W/$CoFe_xB_y$/$MgO_x$, Hf/$CoFe_xB_y$/$MgO_x$, Ta/Ru/$CoFe_xB_y$/$MgO_x$, Ru/Ta/$CoFe_xB_y$/$MgO_x$, W/Ta/$CoFe_xB_y$/$MgO_x$, Ta/W/$CoFe_xB_y$/$MgO_x$, W/Ru/$CoFe_xB_y$/$MgO_x$, Ru/W/$CoFe_xB_y$/$MgO_x$, Hf/Ta/$CoFe_xB_y$/$MgO_x$, Ta/Hf/$CoFe_xB_y$/$MgO_x$, W/Hf/$CoFe_xB_y$/$MgO_x$, Hf/W/$CoFe_xB_y$/$MgO_x$, Hf/Ru/$CoFe_xB_y$/$MgO_x$, Ru/Hf/$CoFe_xB_y$/$MgO_x$, Ta/W/Ru/$CoFe_xB_y$/$MgO_x$, Ta/Ru/W/$CoFe_xB_y$/$MgO_x$, and Ru/Ta/Ru/$CoFe_xB_y$/$MgO_x$. Still alternatively, the seed layer 192 may include a multilayer structure formed by interleaving seed sublayers of a first type with seed sublayers of a second type. One or both types of the seed sublayers may comprise one or more ferromagnetic elements, such as Co, Fe, and Ni. For example and without limitation, the seed layer 192 may be formed by interleaving layers of Ni with layers of a transition metal, such as but not limited to Ti, Zr, Hf, V, Nb, Ta, Cr, Mo, W, or any combination thereof. One or both types of seed sublayers may be amorphous or noncrystalline. For example and without limitation, the first and second types of sublayers may respectively be made of Ta and $CoFe_xB_y$, both of which may be amorphous.

The optional cap layer 194 of the exemplary structures of 5A, 5B, 6A, and 6B, if present, may comprise two, three, four, or more sublayers formed adjacent to each other. One or more of the single layer and the multiple sublayers of the cap layer 194 may comprise one or more of the following elements: B, Mg, Ti, Zr, Hf, V, Nb, Ta, Cr, Mo, W, Mn, Re, Fe, Ru, Os, Co, Rh, Ir, Ni, Pd, Pt, Cu, Ag, Au, Al, Si, Ge, Ga, O, N, and C. For example and without limitation, the cap layer 194 may include a layer of $MgO_x$, Ta, Hf, W, Mo, Ru, Pt, or Pd. Alternatively, the cap layer 194 may include a bilayer structure (W/Ta) comprising a W sublayer formed adjacent to one of the magnetic layers 200 and 222 and a Ta sublayer formed on top of the W sublayer. Other exemplary bilayer structures (bottom/top), such as Ta/Ru, Ru/Ta, Ta/Hf, Hf/Ta, Ta/W, Mo/Ta, Ta/Mo, W/Hf, Hf/W, Mo/Hf, Hf/Mo, Ru/W, W/Ru, $MgO_x$/Ta, Ta/$MgO_x$, $MgO_x$/Ru, $MgO_x$/Hf, and $MgO_x$/W, may also be used for the cap layer 194. Still alternatively, the cap layer 194 may include a bilayer structure comprising an oxide sublayer, such as $MgO_x$, formed adjacent to one of the magnetic layers 200 and 222 and a thin conductive sublayer, such as $CoFe_xB_y$, which may be non-magnetic or superparamagnetic. Additional cap sublayers may further form on top of the exemplary $MgO_x$/$CoFe_xB_y$ cap layer to form other cap layer structures, such as but not limited to $MgO_x$/$CoFe_xB_y$/Ru, $MgO_x$/$CoFe_xB_y$/Ta, $MgO_x$/$CoFe_xB_y$/W, $MgO_x$/$CoFe_xB_y$/Hf, $MgO_x$/$CoFe_xB_y$/Ru/Ta, $MgO_x$/$CoFeB_y$/Ta/Ru, $MgO_x$/$CoFe_xB_y$/W/Ta, $MgO_x$/$CoFe_xB_y$/Ta/W, $MgO_x$/$CoFe_xB_y$/W/Ru, $MgO_x$/$CoFe_xB_y$/Ru/W, $MgO_x$/$CoFe_xB_y$/Hf/Ta, $MgO_x$/$CoFe_xB_y$/Ta/Hf, $MgO_x$/$CoFe_xB_y$/Hf/W, $MgO_x$/$CoFe_xB_y$/W/Hf, $MgO_x$/$CoFe_xB_y$/Hf/Ru, $MgO_x$/$CoFe_xB_y$/Ru/Hf, $MgO_x$/$CoFe_xB_y$/Ru/W/Ta, $MgO_x$/$CoFe_xB_y$/W/Ru/Ta, and $MgO_x$/$CoFe_xB_y$/Ru/Ta/Ru.

As such, the cap layer 194 may comprise an insulating cap sublayer and one or more conductive cap sublayers formed thereon.

The bottom electrode 106 may include one or more of the following elements: Au, Ag, Cu, Pt, Pd, Ni, Ir, Rh, Co, Os, Ru, Fe, Re, Mn, W, Mo, Cr, Ta, Nb, V, Hf, Zr, Ti, Mg, Zn, Cd, In, Ga, Al, B, Pb, Sn, Ge, Si, C, Bi, Sb, As, N, Te, and Se to form a suitable electrode material, such as but not limited to Au, Ag, Pt, Pd, Rh, Ir, Ru, Re, Si, Ni, $NiSi_x$, $NiCr_x$, Cu, $CuSi_x$, $CuGe_x$, $CuAl_x$, $CuN_x$, Co, $CoSi_x$, $CoCr_x$, Zn, $ZnN_x$, Fe, $FeNi_xCr_y$, Cr, $CrSi_x$, Al, $AlN_x$, Ti, $TiSi_x$, $TiN_x$, Ta, $TaSi_x$, $TaN_x$, W, $WSi_x$, $WN_x$, Mo, $MoSi_x$, $MoN_x$, Zr, $ZrSi_x$, $ZrN_x$, Hf, $HfSi_x$, $HfN_x$, Nb, $NbSi_x$, $NbN_x$, V, $VSi_x$, $VN_x$, $TlAl_x$, $NlAl_x$, $CoAl_x$, or any combination thereof. Alternatively, the bottom electrode 106 may made of a topological insulator, such as but not limited to antimony (Sb), bismuth selenide ($Bi_2Se_3$), bismuth telluride ($Bi_2Te_3$), antimony telluride ($Sb_2Te_3$), lead bismuth telluride ($PbBi_2Te_4$), lead antimony telluride ($PbSb_2Te_4$), or any combination thereof.

The vertical conductive lines 108 and 108' each may be made of a suitable conducting material, such as but not limited to Al, $AlN_x$, Cu, $CuN_x$, Ta, $TaN_x$, Ru, Ir, Rh, Ti, $TiN_x$, Zr, $ZrN_x$, Hf, $HfN_x$, V, $VN_x$, Nb, $NbN_x$, Cr, Mo, W, $NiCr_x$, $FeNi_xCr$, $NiTa_x$, $NiZr_x$, $NiHf_x$, $NiV_x$, $NiNb_x$, $NiMo_x$, $NiW_x$, $TiSi_x$, $NiSi_x$, $CoSi_x$, $CoCr_x$, $CoTi_x$, $CoTa_x$, $CoZr_x$, $CoHf_x$, $CoV_x$, $CoNb_x$, $CoMo_x$, $CoW_x$, or any combination thereof.

The horizontal conductive line 104 may be made of a suitable conducting material, such as but not limited to Al, $AlN_x$, Cu, $CuN_x$, Ta, $TaN_x$, Ru, Ir, Rh, Ti, $TiN_x$, Zr, $ZrN_x$, Hf, $HfN_x$, V, $VN_x$, Nb, $NbN_x$, Cr, Mo, W, $NiCr_x$, $FeNi_xCr$, $NiTi_x$, $NiTa_x$, $NiZr_x$, $NiHf_x$, $NiV_x$, $NiNb_x$, $NiMo_x$, $NiW_x$, $TiSi_x$, $NiSi_x$, $CoSi_x$, $CoCr_x$, $CoTi_x$, $CoTa_x$, $CoZr_x$, $CoHf_x$, $CoV_x$, $CoNb_x$, $CoMo_x$, $CoW_x$, or any combination thereof.

Figure 12:
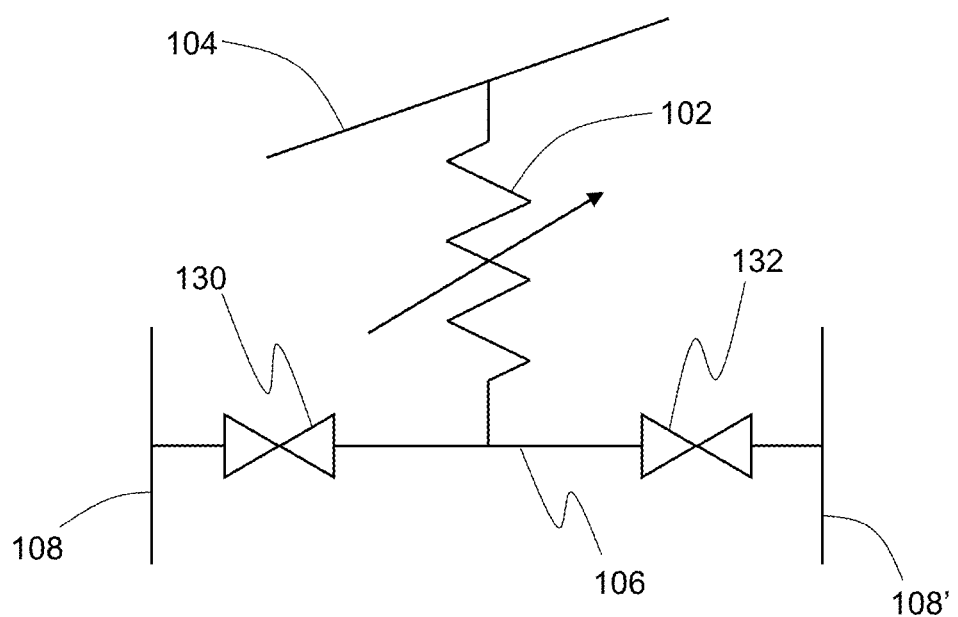
FIG. 12 is a schematic circuit diagram corresponding to the memory cell illustrated in FIG. 3.

Operation of the stackable memory cell 100 incorporating dual selector elements will now be described with reference to FIG. 12, which is a schematic circuit diagram for the memory cell shown in FIG. 3. In the drawing numerals 102 to 108 denote the same components as those shown in FIG. 3. The magnetic memory element 102 may be selected for read or write operation by turning on one or both of the selector elements 130 and 132 to allow a current flowing through the magnetic memory element 102. In an embodiment, the first and second selector elements 130 and 132 are substantially identical and have a same threshold voltage, $V_{th}$, beyond which the selector elements 130 and 132 become conductive or turn on. One of the two selector elements 130 and 132 may be turned on while the other one remains off during a read or write operation. For example and without limitation, the first selector element 130 may become conductive by applying voltages of V/2, -V/2, and 0 to the horizontal conductive line 104, the first vertical conductive line 108, and the second vertical conductive line 108', respectively, wherein $V>V_{th}>V/2$. The first selector element 130 may alternatively be turned on by applying voltages of V, 0, and V/2 to the horizontal conductive line 104, the first vertical conductive line 108, and the second vertical conductive line 108', respectively. Both of the selector elements 130 and 132 may become conductive by applying voltages of V, 0, and 0 to the horizontal conductive line 104, the first vertical conductive line 108, and the second vertical conductive line 108', respectively. Alternatively, both of the selector elements 130 and 132 may become conductive by applying voltages of V/2, -V/2, and -V/2 to the horizontal conductive line 104, the first vertical conductive line 108, and the second vertical conductive line 108', respectively. The current flow direction in the above examples can be reversed by swapping the voltages between the horizontal conductive line 104 and the first vertical conductive line 108 and/or between the horizontal conductive line 104 and the second vertical conductive line 108'. In a write operation, both selector elements 130 and 132 may be turned on to maximize the write current flowing through the magnetic memory element 102. In a read operation, only one of the two selector elements 130 and 132 may be turned on to minimize the read current flowing through the magnetic memory element 102.

Figure 3:
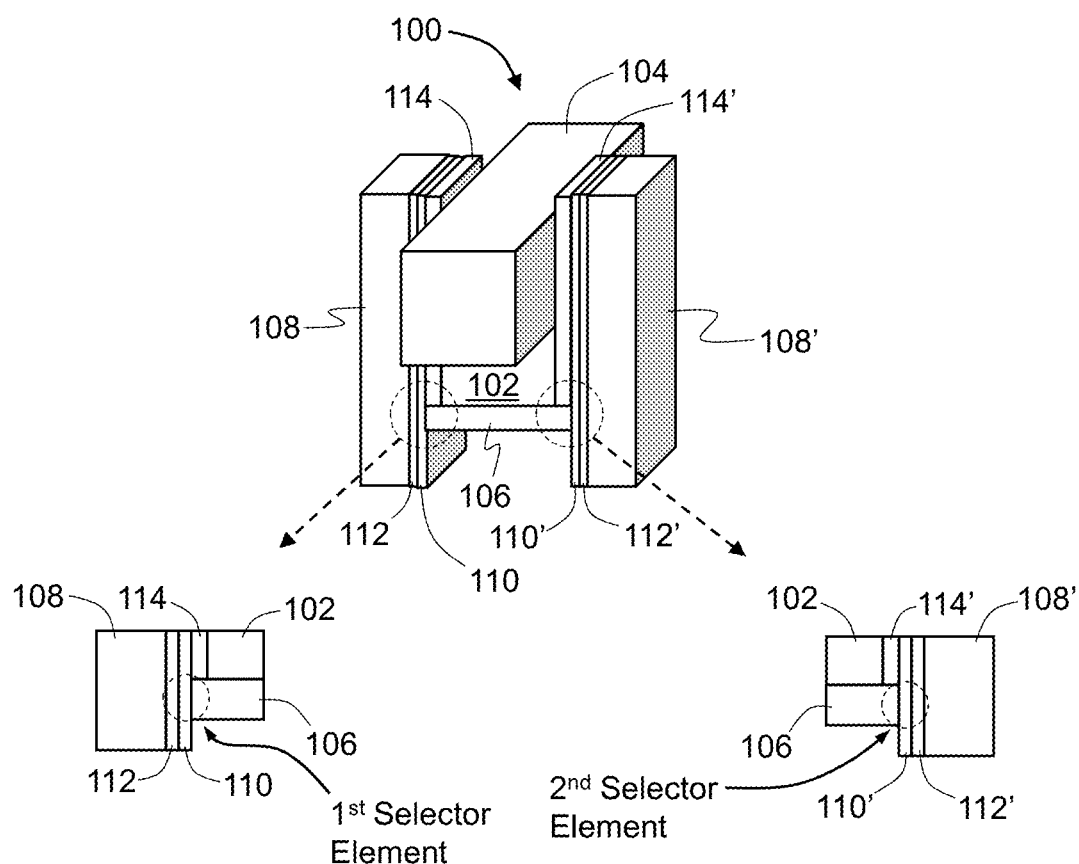
FIG. 3 is a perspective view of a magnetic memory cell in accordance with an embodiment of the present invention.

As discussed above, the resistance of the magnetic memory element 102 shown in FIG. 3 may be switched by passing a switching current between the horizontal conductive line 104 and the first vertical conductive line 108 and/or between the horizontal conductive line 104 and the second vertical conductive line 108'. The switching current passing through the magnetic memory element 102 generates a spin transfer torque (STT) that switches the magnetization direction 206 of the magnetic free layer structure 200 with respect to the magnetization direction 208 of the magnetic reference layer structure 208.

Figure 13:
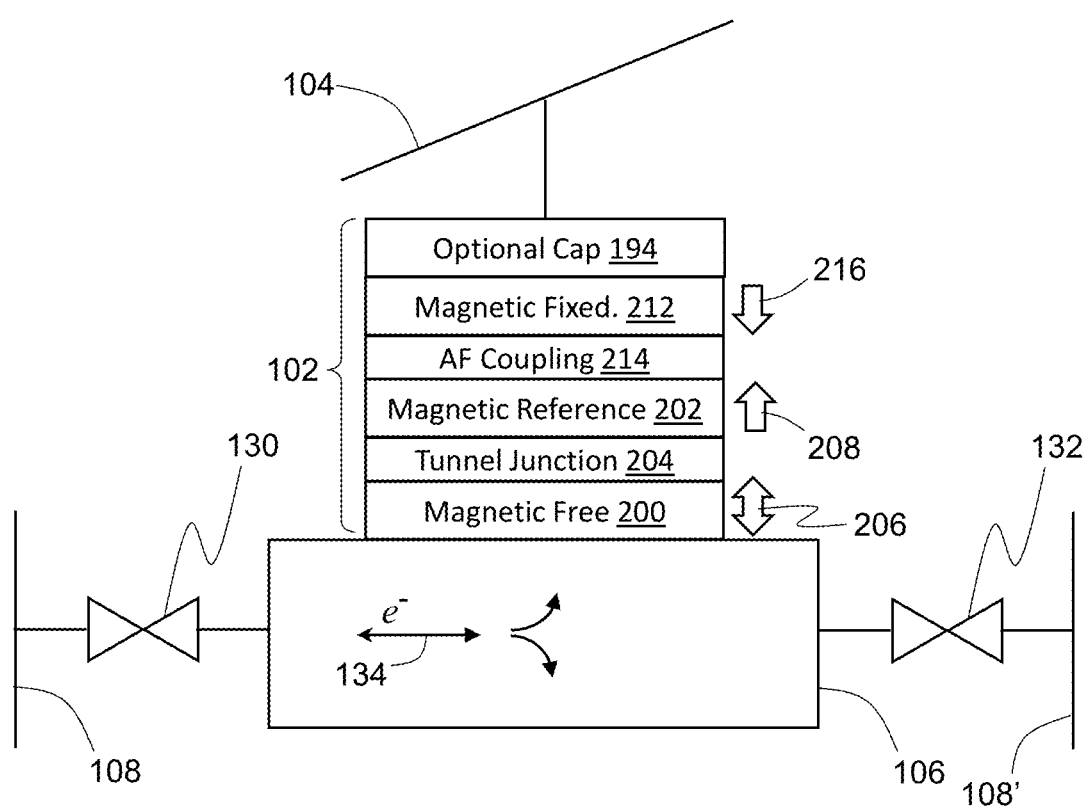
FIG. 13 illustrates a mode of operation for the memory cell in accordance with an embodiment of the present invention.

In some embodiments where the magnetic free layer structure 200 of the magnetic memory element 102 is in contiguous contact with the bottom electrode 102 as shown in FIG. 13, the variable magnetization direction 206 of the magnetic free layer structure 200 may be switched by passing a transverse current 134 through the bottom electrode 106 along a direction substantially parallel to the layer plane of the magnetic free layer structure 200. Without being bound to any theory, it is believed that the switching of the variable magnetization direction 206 by the transverse current 134 that travels on a plane substantially parallel to the layer plane of the bottom electrode 106 is accomplished by the coupling of the charge and spin currents owing to spin-orbit interaction. As the transverse current 134 passes through the bottom electrode 106 made of a heavy metal or a topological insulator, electrons with opposite spin directions diverge and accumulate on top and bottom surfaces of the bottom electrode 106, thereby imparting a spin transfer torque on the magnetic free layer structure 200 to switch the variable magnetization direction 206 thereof. Examples of suitable heavy metal and topological insulator for the bottom electrode 106 include tungsten (W), tantalum (Ta), hafnium (Hf), platinum (Pt), gold (Au), iridium (Ir), rhenium (Re), antimony (Sb), bismuth selenide ($Bi_2Se_3$), bismuth telluride ($Bi_2Te_3$), antimony telluride ($Sb_2Te_3$), lead bismuth telluride ($PbBi_2Te_4$), lead antimony telluride ($PbSb_2Te_4$), and any combinations thereof. The variable magnetization direction 106 may be switched in both directions by changing the direction of the transverse current 134.

Accordingly, the variable magnetization direction 206 of the magnetic free layer structure 206 formed adjacent to the bottom electrode 206, as illustrated in FIG. 13, may be switched by passing an STT current through the magnetic memory element 102, or passing the transverse current 134 through the bottom electrode 106, or both. For example and without limitation, voltages of V/2, V/2, and -V/2 may be applied to the horizontal conductive line 104, the first vertical conductive line 108, and the second vertical conductive line 108', respectively, to generate both the STT current through the magnetic memory element 102 and the transverse current 134 for switching the variable magnetization direction 206 of the magnetic free layer structure 200.

Referring back to FIG. 12, the first and second selector elements 130 and 132 are different and have threshold voltages, $V_{th1}$ and $V_{th2}$, respectively, in accordance with another embodiment of the present invention. The selector element with lower threshold voltage, say the first selector element 130 with the threshold voltage of $V_{th1}$, may be selected for the read operation for sensing the resistance of the magnetic memory element 102. For example and without limitation, to turn on the first selector element 130 with lower threshold while leaving the second selector element 132 off, voltages of V, 0, and V/2 or V/2, −V/2, and 0 may be applied to the horizontal conductive line 104, the first vertical conductive line 108, and the second vertical conductive line 108', respectively, with $V > V_{th1} > V/2$ and $V_{th2} > V_{th1}$. The direction of the current through the magnetic memory element 102 may be reversed by swapping the voltages applied to the horizontal conductive line 104 and the first vertical conductive line 108. In a write operation, the selector element with higher threshold voltage, say the second selector element 132 with the threshold voltage of Vac, or both selector elements 130 and 132 may be turned on. For example and without limitation, to turn on both selector elements 130 and 132, voltages of V, 0, and 0 or V/2, −V/2, −V/2 may be applied to the horizontal conductive line 104, the first vertical conductive line 108, and the second vertical conductive line 108', respectively, with $V > V_{th2} > V_{th1} > V/2$. To turn on only the second selector element 132, voltages of V, V/2, and 0 or V/2, 0, and −V/2 may be applied to the horizontal conductive line 104, the first vertical conductive line 108, and the second vertical conductive line 108', respectively, with $V > V_{th2} > V_{th1} > V/2$.

Figure 14:
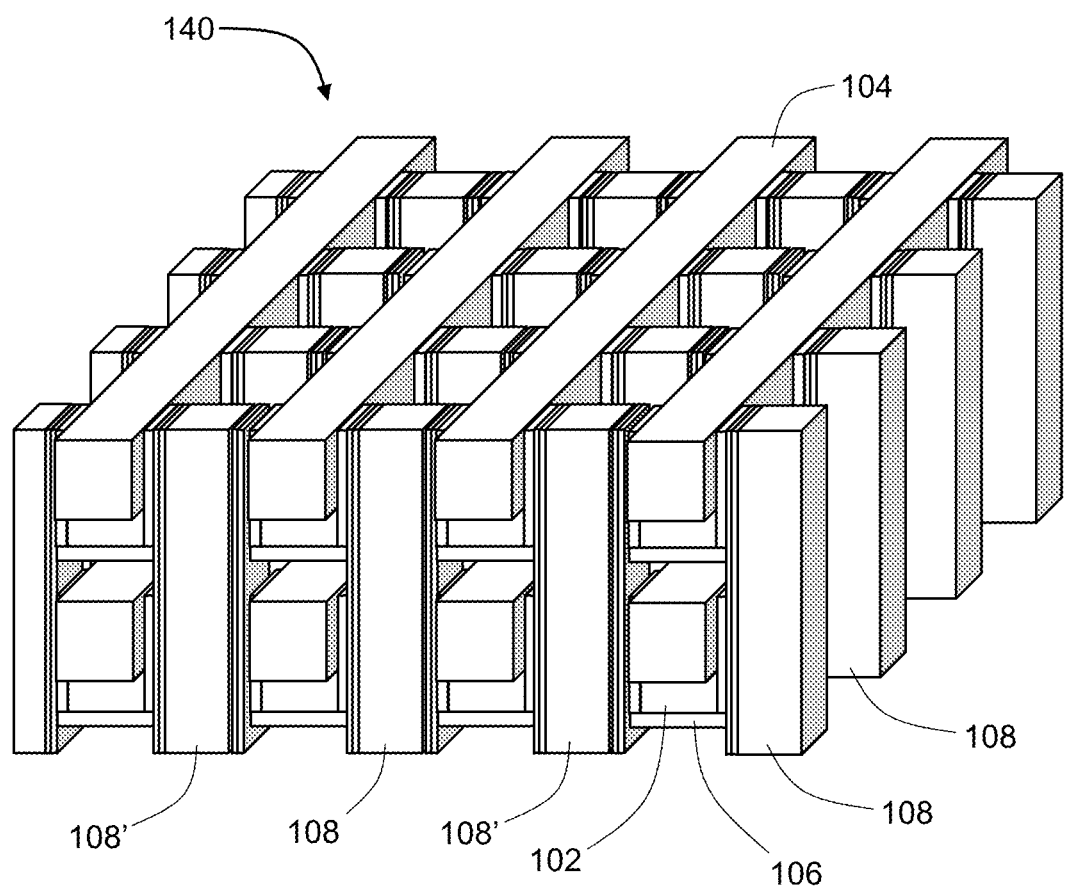
FIG. 14 is a perspective view of a three dimensional memory array in accordance with an embodiment of the present invention.

FIG. 14 shows a perspective view of an exemplary three dimensional array of the memory cells 100 in accordance with an embodiment of the present invention. While the three dimensional memory array 140 is shown to have two layers of memory cells 100, one or more layers may be used in the memory array 140. Each layer of memory cells 100 includes a plurality of memory cells 100 arranged in a square array that extends along a first direction and a second direction substantially perpendicular to the first direction; a plurality of horizontal conductive lines 104 extending along the first direction with each horizontal conductive line coupled to a respective row of magnetic memory elements 102 along the first direction; a plurality of first vertical conductive lines 108 shared between two adjacent memory cells 100 along the second direction; and a plurality of second vertical conductive lines 108' shared between two adjacent memory cells 100 along the second direction. The first and second vertical conductive lines 108 and 108' extend in a direction that is substantially perpendicular to the substrate surface on which the memory array 140 is formed. Each of the first and second vertical conductive lines 108 and 108' is coupled to a respective pair of memory cells 100 and all memory cells formed directly above the respective pair. Therefore, the numbers of the first and second vertical conductive lines 108 and 108' do not change with increasing number of memory layers.

Figure 15:
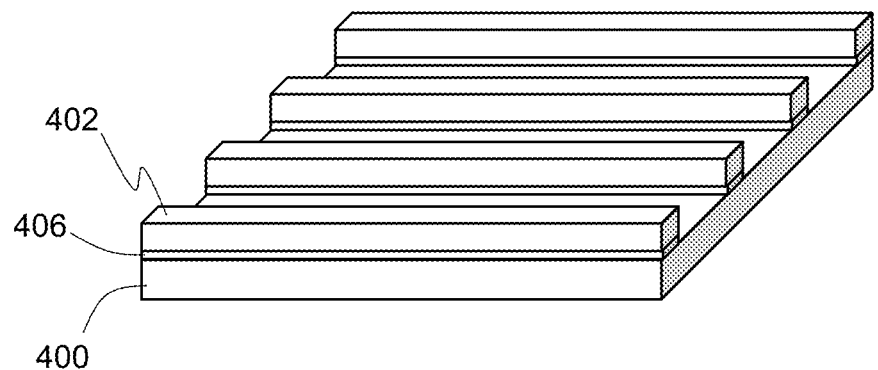
FIGS. 15-28 are perspective views of the three dimensional memory array in various stages that illustrate fabrication process.

Fabrication of the memory array 140 will now be described with reference to FIGS. 15-28, which illustrate various intermediate structures of the memory array 140 shown in FIG. 14. The processing starts by depositing a bottom electrode layer 406 and a film stack for the magnetic memory element 402 on top of a first dielectric layer 400. The film stack for the magnetic memory element 402 and the bottom electrode layer 406 are then patterned into discrete parallel lines extending along the second direction as illustrated in FIG. 15. The patterning process may be carried out using photolithography and reactive ion etching (RIE) or ion beam etching (IBE).

Figure 16:
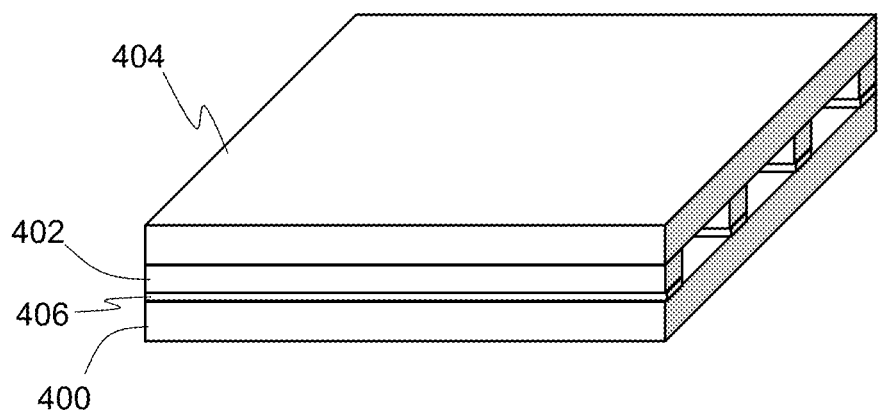
Figure 17:
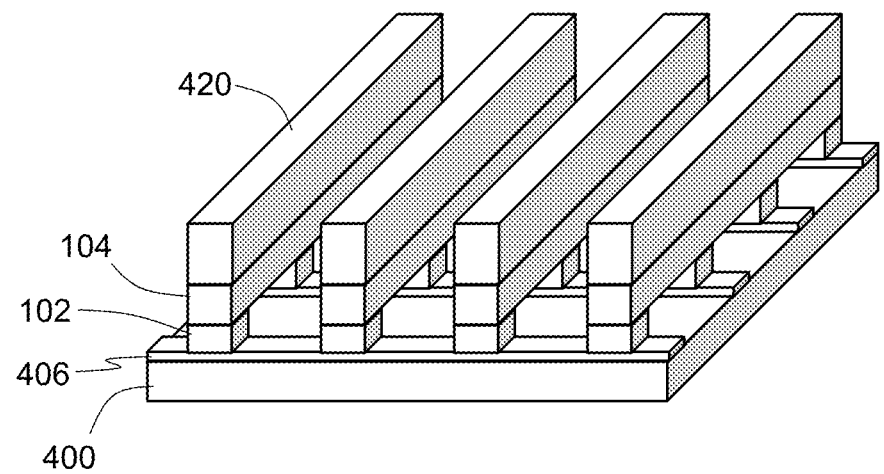

Following the patterning step, the space between the lines made of the film stack for the magnetic memory element 402 and the bottom electrode layer 406 is filled with a second dielectric material by any suitable deposition process, such as but not limited to physical vapor deposition (PVD), chemical vapor deposition (CVD), plasma-enhanced chemical vapor deposition (PECVD), atomic layer deposition (ALD), or any combination thereof. The excess second dielectric material formed above the lines are then removed by chemical mechanical planarization (CMP) to form a planarized surface, onto which a conductive layer for the horizontal conductive lines 404 is deposited as illustrated in FIG. 16.

The processing continues by depositing a third dielectric layer on top of the conductive layer for the horizontal conductive lines 404 and patterning both layers into discrete parallel lines of horizontal conductive lines 104 and first interlayer dielectric layer (ILD) 420 on top thereof extending along the first direction perpendicular to the second direction. The patterning process may be carried out using photolithography with the first ILD 420 serving as a hard mask for the subsequent etching process, such as but not limited to RIE or IBE or any combination thereof. The etching process also removes portions of the film stack for the magnetic memory element 402 not covered by the first ILD 420 hard mask to form discrete magnetic memory elements 102, while leaving the lines of the bottom electrode layer 406 mostly intact.

Figure 18:
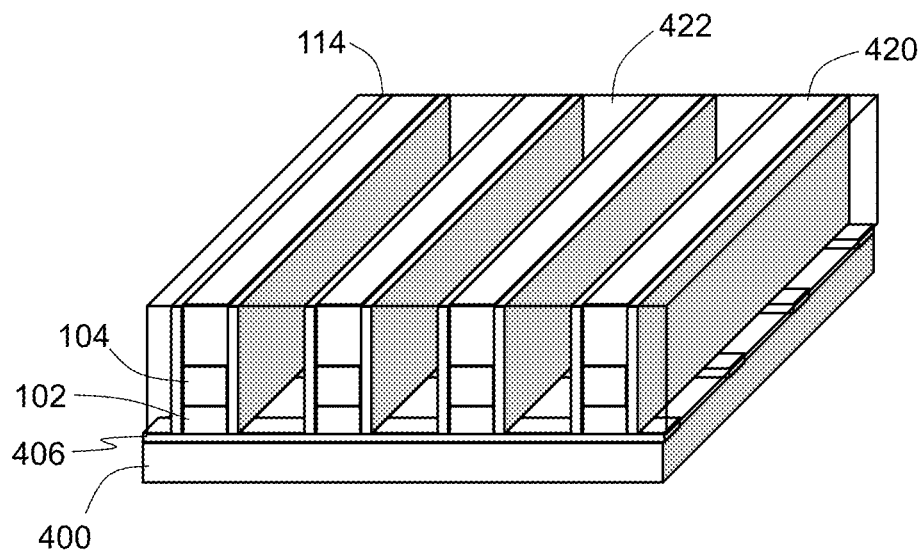

Following the patterning step, a fourth dielectric layer is conformally deposited over the sidewalls of the first ILD 420, the horizontal conductive lines 104, and the magnetic memory elements 102 to form the vertical dielectric layers 114, as illustrated in FIG. 18, by a conformal deposition process, such as but not limited to CVD, ALD, PECVD, or any combination thereof. The space between the lines of the first ILD 420, the horizontal conductive lines 104, and the magnetic memory elements 102 is filled with a fifth dielectric material 422 by PVD, CVD, PECVD, ALD, or any combination thereof. The fifth dielectric material 422 is made transparent in the drawing to reveal the surrounding structure thereof. After the deposition of the fifth dielectric material 422, excess material above the lines are removed by CMP.

Figure 19:
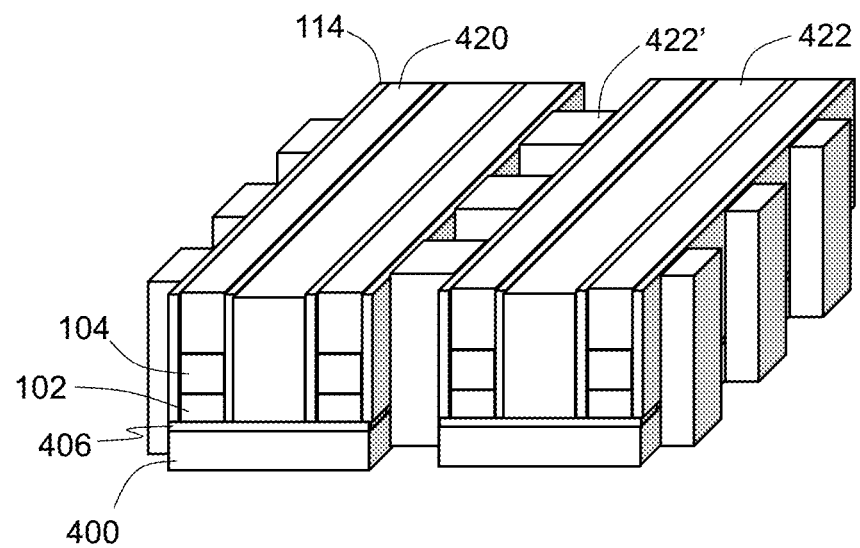
Figure 20:
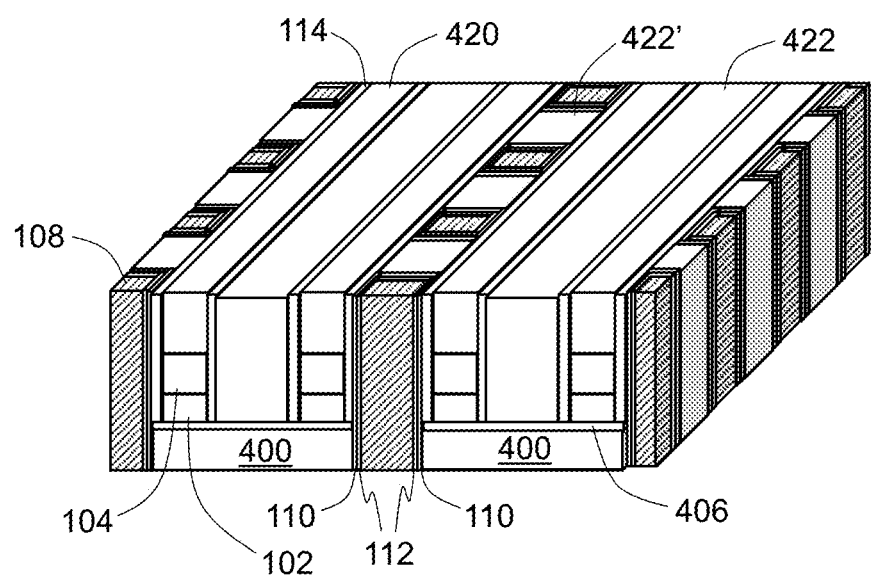

After the planarization process, holes are etched through portions of the fifth dielectric material 422, the bottom electrode layer 406, and the first dielectric layer 400 as illustrated in FIG. 19. The volatile switching layer 110 and the vertical electrode layer 112 for the first selector elements are then conformally deposited on the sidewalls of the holes by CVD, PECVD, ALD, or any combination thereof to form the first selector elements as shown in FIG. 20. The holes are further filled with a conductive material to form the first vertical conductive lines 108. Excess material on top of the first ILD 420 is removed by a planarization process, such as CMP.

Figure 21:
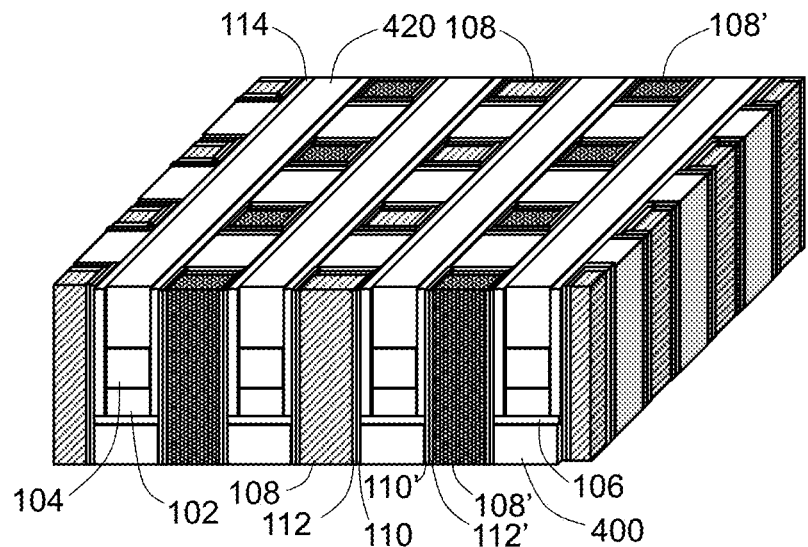

The steps of hole etching and conformal deposition as illustrated in FIGS. 19 and 20 and described above may be similarly repeated to form the volatile switching layer 110' and the vertical electrode layer 112' for the second selector elements and the second vertical conductive lines 108' as shown in FIG. 21, thereby completing the first layer of memory cells 100. In embodiments where the first and second selector elements are substantially identical, the hole etching process and conformal deposition for both types of selector elements and the vertical conductive lines 108 and 108' may be carried out at the same time, thereby reducing the number of processing steps.

Figure 22:
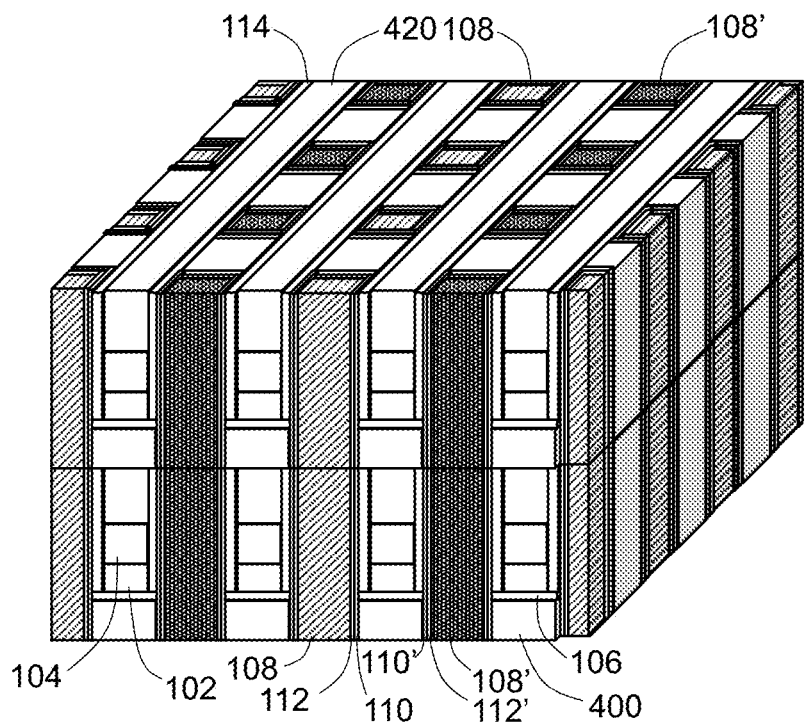

One or more additional layers of the memory cells 100 may formed on top of the first layer, as illustrated in FIG. 22, by simply repeating the steps illustrated in FIGS. 15-21 and described above.

Figure 23:
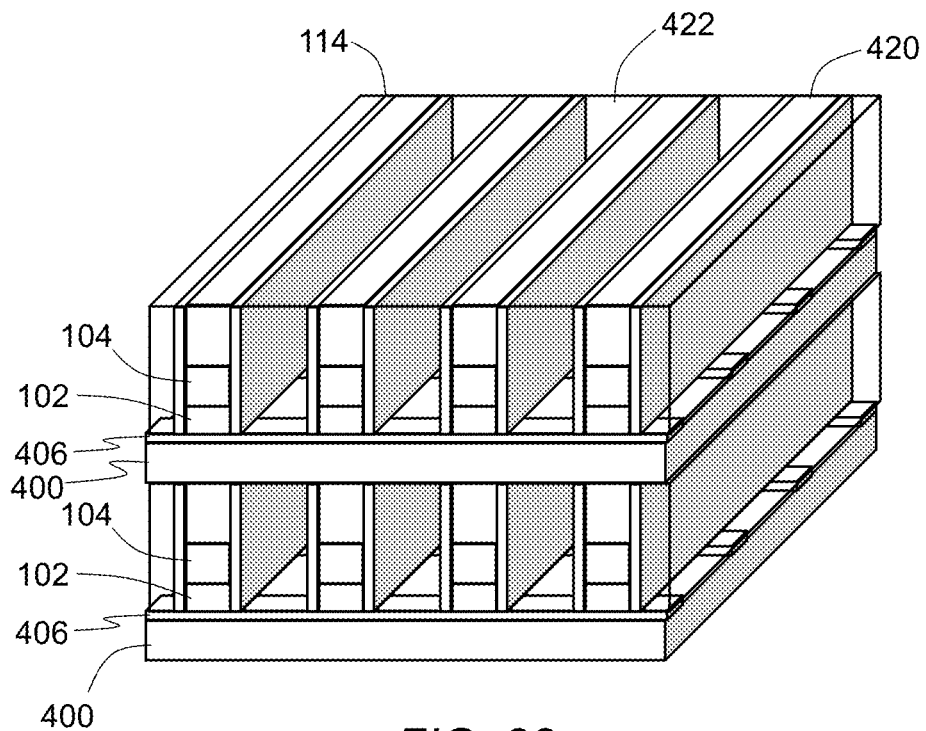

Alternatively, multiple layers of memory cells may be fabricated by following the processing steps described above with reference to FIGS. 15-18 to form a layer of intermediate structure shown in FIG. 18 and then repeating the same processing steps to form one or more additional layers of the intermediate structure above the first layer as shown in FIG. 23. Each layer of the intermediate structure includes parallel lines of the first ILD 420, the horizontal conductive lines 104, and the magnetic memory elements 102 separated by the fifth dielectric material 422.

Figure 24:
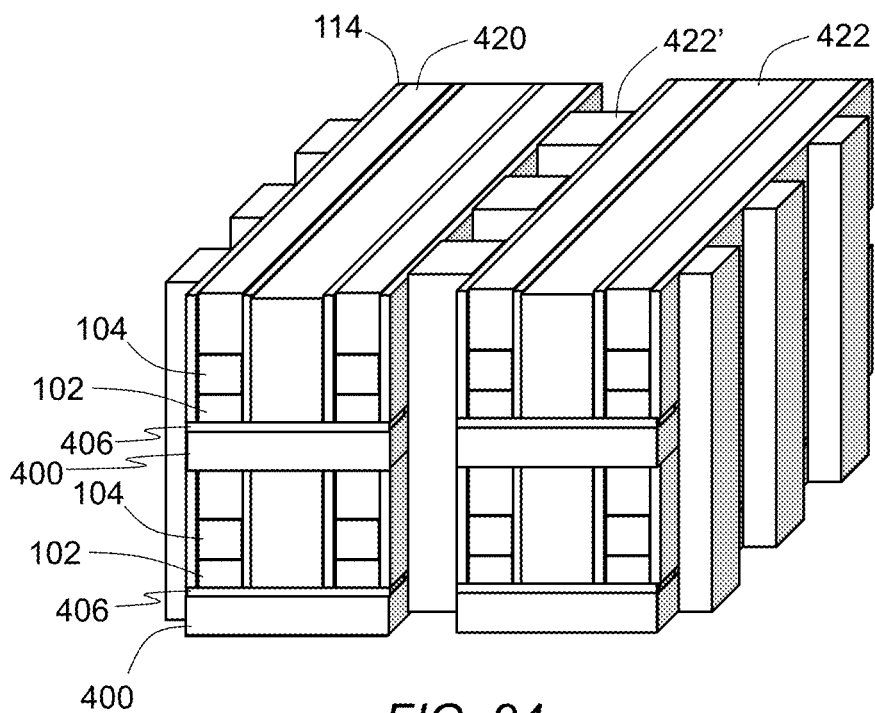
Figure 25:
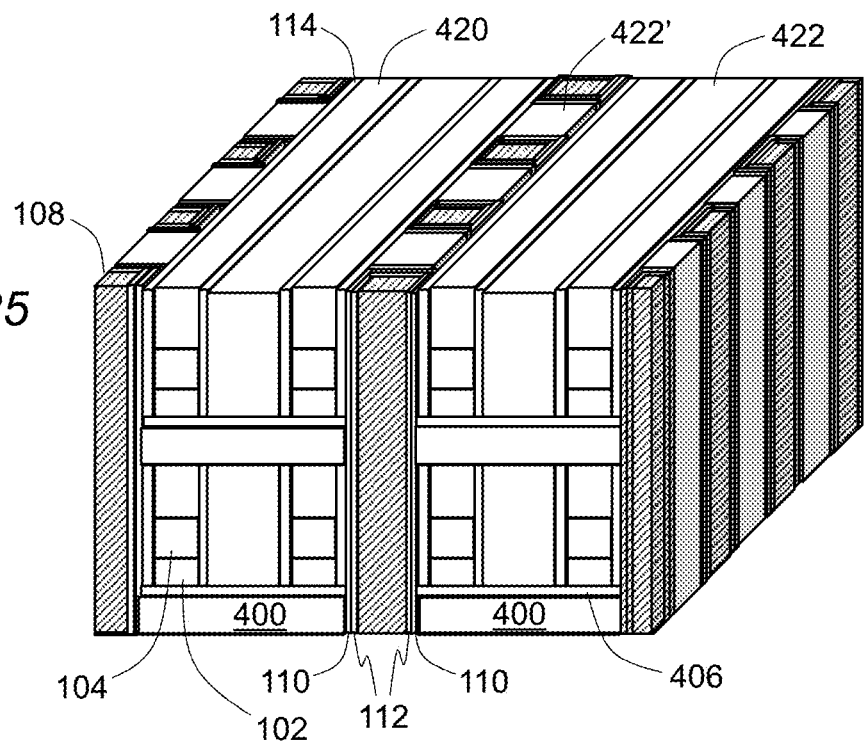

The processing continues by etching holes through portions of the fifth dielectric material 422, the bottom electrode layer 406, and the first dielectric layer 400 for both the top and bottom layers as illustrated in FIG. 24. The volatile switching layer 110 and the vertical electrode layer 112 for the first selector elements are then conformally deposited on the sidewalls of the holes by CVD, PECVD, ALD, or any combination thereof to form the first selector elements as shown in FIG. 25. The holes are further filled with a conductive material to form the first vertical conductive lines 108. Excess material on top of the first ILD 420 is removed by a planarization process, such as CMP.

Figure 26:
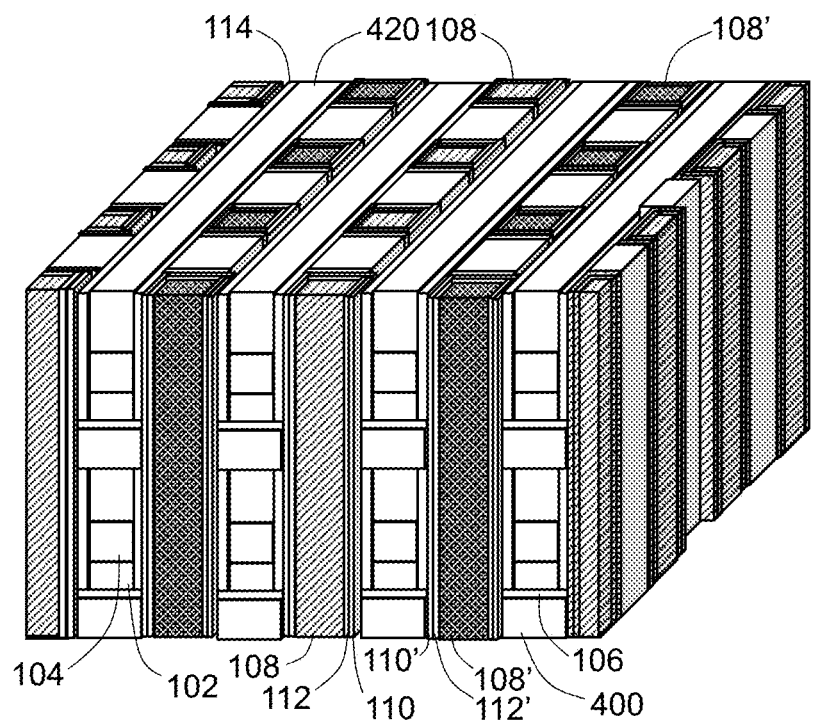

The steps of hole etching and conformal deposition as illustrated in FIGS. 24 and 25 and described above may be similarly repeated to form the volatile switching layer 110' and the vertical electrode layer 112' for the second selector elements and the second vertical conductive lines 108' as shown in FIG. 26, thereby completing the three dimensional array of memory cells 100.

Figure 27:
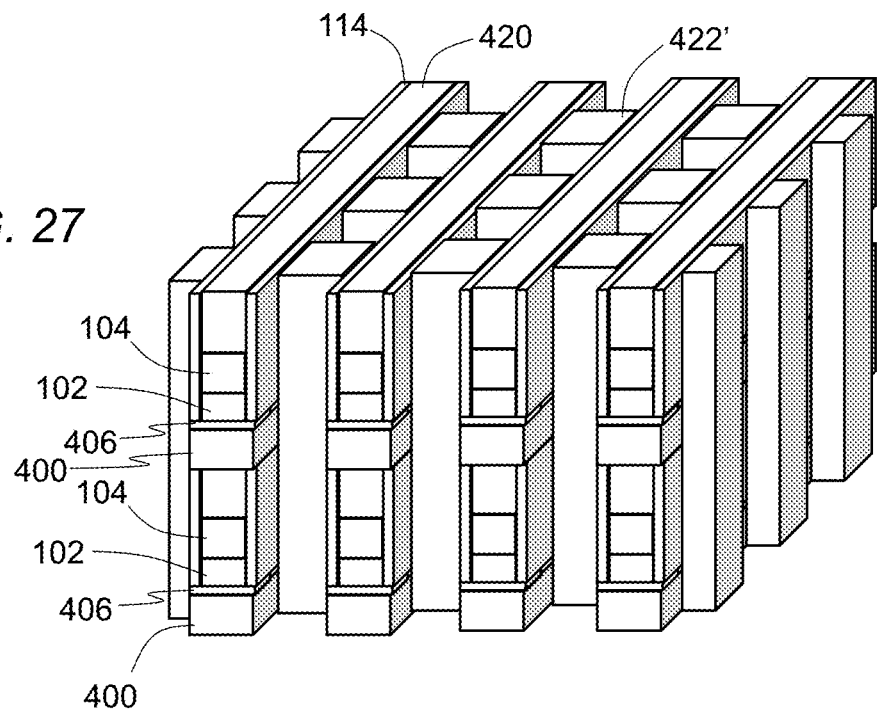
Figure 28:
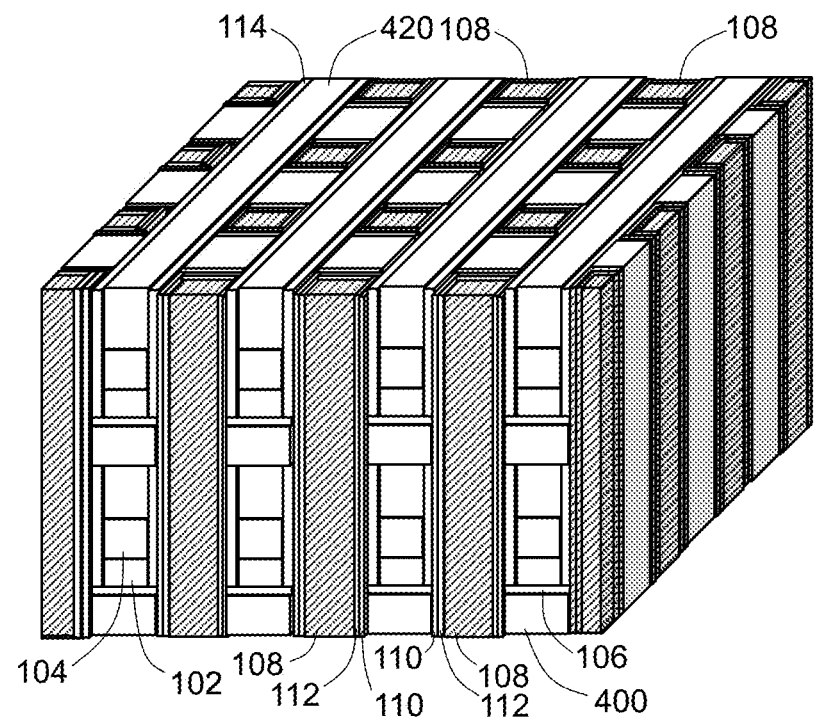

In embodiments where the first and second selector elements are substantially identical, the hole etching process and conformal deposition for both types of selector elements and the vertical conductive lines 108 and 108' after the step shown in FIG. 23 may be carried out at the same time as shown in FIGS. 27 and 28, thereby reducing the number of processing steps.

Although the present invention is described with reference to a magnetic memory element, other types of non-volatile memory elements may be used instead. Examples of non-volatile memory that is compatible with the present invention include Phase Change Random Access Memory (PCRAM) comprising a phase change chalcogenide compound and Conductive Bridging Random Access Memory (CBRAM) comprising a nominally insulating metal oxide material, which can switch to a lower electrical resistance state as metal rich precipitates in the metal oxide material grow and link to form conductive paths upon application of an appropriate voltage.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

Any element in a claim that does not explicitly state "means for" performing a specified function, or "step for" performing a specific function, is not to be interpreted as a "means" or "step" clause as specified in 35 U.S.C. § 112, ¶ 6. In particular, the use of "step of" in the claims herein is not intended to invoke the provisions of 35 U.S.C. § 112, ¶ 6.

What is claimed is:

1. A memory device comprising:
   a magnetic memory element;
   a horizontal conductive line disposed above said magnetic memory element;
   a bottom electrode formed beneath said magnetic memory element, said bottom electrode having a top, first and second sides that are opposite to each other;
   a first vertical conductive line electrically connected to said first side of said bottom electrode with a first volatile switching layer and a first electrode layer interposed therebetween; and
   a second vertical conductive line electrically connected to said second side of said bottom electrode with a second volatile switching layer and a second electrode layer interposed therebetween,
   wherein said magnetic memory element is electrically connected to said horizontal conductive line at one end and to said bottom electrode at the other end.

2. The memory device of claim 1, wherein said first side of said bottom electrode, said first volatile switching layer, and said first electrode layer collectively form a first selector element electrically connected to said magnetic memory element.

3. The memory device of claim 1, wherein said second side of said bottom electrode, said second volatile switching layer, and said second electrode layer collectively form a second selector element electrically connected to said magnetic memory element.

4. The memory device of claim 1, wherein said first and second volatile switching layers are made of different materials.

5. The memory device of claim 1, wherein said first and second volatile switching layers are made of a same material.

6. The memory device of claim 1 further comprising one or more electrode layers formed between said first volatile switching layer and said first side of said bottom electrode.

7. The memory device of claim 1 further comprising one or more electrode layers formed between said first volatile switching layer and said first vertical conductive line.

8. The memory device of claim 1 further comprising one or more electrode layers formed between said second volatile switching layer and said second side of said bottom electrode.

9. The memory device of claim 1 further comprising one or more electrode layers formed between said second volatile switching layer and said second vertical conductive line.

10. The memory device of claim 1, wherein said magnetic memory element includes a magnetic free layer structure and a magnetic reference layer structure with an insulating tunnel junction layer interposed therebetween, said magnetic fixed layer having a first invariable magnetization direction substantially perpendicular to a layer plane thereof, said magnetic free layer structure having a variable magnetization direction substantially perpendicular to a layer plane thereof.

11. The memory device of claim 10, wherein said magnetic free layer structure is in contiguous contact with said bottom electrode.

12. A memory device comprising:
   a magnetic memory element including a magnetic free layer structure and a magnetic reference layer structure with an insulating tunnel junction layer interposed therebetween, said magnetic fixed layer having a first invariable magnetization direction substantially perpendicular to a layer plane thereof, said magnetic free layer structure having a variable magnetization direction substantially perpendicular to a layer plane thereof;
a horizontal conductive line disposed above said magnetic memory element;
a bottom electrode formed beneath said magnetic memory element, said bottom electrode having a top, first and second sides that are opposite to each other;
a first vertical conductive line electrically connected to said first side of said bottom electrode with a first volatile switching layer and a first electrode layer interposed therebetween; and
a second vertical conductive line electrically connected to said second side of said bottom electrode with a second volatile switching layer and a second electrode layer interposed therebetween,
wherein said magnetic memory element is electrically connected to said horizontal conductive line at one end and to said bottom electrode at the other end,
wherein said magnetic memory element further includes a magnetic fixed layer structure separated from said magnetic reference layer by an anti-ferromagnetic coupling layer, said magnetic fixed layer structure having a second invariable magnetization direction that is substantially perpendicular to a layer plane thereof and is opposite to said first invariable magnetization direction.

13. A memory device comprising:
a magnetic memory element including a magnetic free layer structure and a magnetic reference layer structure with an insulating tunnel junction layer interposed therebetween, said magnetic fixed layer having a first invariable magnetization direction substantially perpendicular to a layer plane thereof, said magnetic free layer structure having a variable magnetization direction substantially perpendicular to a layer plane thereof;
a horizontal conductive line disposed above said magnetic memory element;
a bottom electrode formed beneath said magnetic memory element, said bottom electrode having a top, first and second sides that are opposite to each other;
a first vertical conductive line electrically connected to said first side of said bottom electrode with a first volatile switching layer and a first electrode layer interposed therebetween; and
a second vertical conductive line electrically connected to said second side of said bottom electrode with a second volatile switching layer and a second electrode layer interposed therebetween,
wherein said magnetic memory element is electrically connected to said horizontal conductive line at one end and to said bottom electrode at the other end,
wherein said magnetic memory element further includes a magnetic fixed layer structure separated from said magnetic reference layer by an anti-ferromagnetic coupling layer comprising iridium, said magnetic fixed layer structure having a second invariable magnetization direction that is substantially perpendicular to a layer plane thereof and is opposite to said first invariable magnetization direction.

* * * * *